(12) United States Patent
Tompkins et al.

(10) Patent No.: US 9,619,590 B2
(45) Date of Patent: Apr. 11, 2017

(54) UNCERTAINTY ESTIMATION FOR LARGE-SCALE NONLINEAR INVERSE PROBLEMS USING GEOMETRIC SAMPLING AND COVARIANCE-FREE MODEL COMPRESSION

(75) Inventors: Michael J. Tompkins, San Francisco, CA (US); Juan Luis Fernandez-Martinez, Oviedo (ES)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 967 days.

(21) Appl. No.: 13/634,522

(22) PCT Filed: Mar. 14, 2011

(86) PCT No.: PCT/US2011/028385
§ 371 (c)(1),
(2), (4) Date: Mar. 25, 2013

(87) PCT Pub. No.: WO2011/115921
PCT Pub. Date: Sep. 22, 2011

(65) Prior Publication Data
US 2013/0185033 A1    Jul. 18, 2013

Related U.S. Application Data

(60) Provisional application No. 61/315,644, filed on Mar. 19, 2010.

(51) Int. Cl.
*G06G 7/48*     (2006.01)
*G06F 7/60*     (2006.01)
(Continued)

(52) U.S. Cl.
CPC .......... *G06F 17/5009* (2013.01); *G01V 11/00* (2013.01); *G06F 17/11* (2013.01)

(58) Field of Classification Search
CPC .......................... G01V 2210/62; G01V 11/00
(Continued)

(56) References Cited

U.S. PATENT DOCUMENTS

| 5,798,982 A | 8/1998 | He et al. |
| 7,502,690 B2 * | 3/2009 | Thomsen .............. G01V 3/083 367/21 |

(Continued)

FOREIGN PATENT DOCUMENTS

WO    2011115921 A2    9/2011

OTHER PUBLICATIONS

Schwarzbach et al., 2D inversion of direct current resistivity data using a parallel, multi-objective genetic algorithm, 2005, Geophys J Int 162, pp. 685-695.*

(Continued)

*Primary Examiner* — Kamini S Shah
*Assistant Examiner* — Juan Ochoa
(74) *Attorney, Agent, or Firm* — Abimbola Bukoye

(57) ABSTRACT

A method for uncertainty estimation for nonlinear inverse problems includes obtaining an inverse model of spatial distribution of a physical property of subsurface formations. A set of possible models of spatial distribution is obtained based on the measurements. A set of model parameters is obtained. The number of model parameters is reduced by covariance free compression transform. Upper and lower limits of a value of the physical property are mapped to orthogonal space. A model polytope including a geometric region of feasible models is defined. At least one of random and geometric sampling of the model polytope is performed in a reduced-dimensional space to generate an equi-feasible ensemble of models. The reduced-dimensional space includes an approximated hypercube. Probable model samples are evaluated based on data misfits from among an (Continued)

equi-feasible model ensemble determined by forward numerical simulation. Final uncertainties are determined from the equivalent model ensemble and the final uncertainties are displayed in at least one map.

6 Claims, 23 Drawing Sheets

(51) Int. Cl.
  *G06F 17/50* (2006.01)
  *G01V 11/00* (2006.01)
  *G06F 17/11* (2006.01)
(58) Field of Classification Search
  USPC .................................................. 703/2, 10
  See application file for complete search history.

(56) References Cited

U.S. PATENT DOCUMENTS

| | | | | |
|---|---|---|---|---|
| 7,504,829 | B2* | 3/2009 | Watts | G01V 3/083 |
| | | | | 324/337 |
| 7,536,262 | B2* | 5/2009 | Hornbostel | G01V 3/083 |
| | | | | 166/248 |
| 7,574,057 | B1 | 8/2009 | Yang | |
| 7,667,464 | B2* | 2/2010 | Campbell | G01V 3/083 |
| | | | | 324/338 |
| 7,941,273 | B2* | 5/2011 | Thomsen | G01V 3/12 |
| | | | | 367/38 |
| 2008/0239340 | A1 | 10/2008 | Chang et al. | |
| 2008/0265896 | A1* | 10/2008 | Strack | G01V 3/12 |
| | | | | 324/350 |
| 2009/0265111 | A1* | 10/2009 | Helwig | G01V 3/12 |
| | | | | 702/7 |

OTHER PUBLICATIONS

Jafarpour et al., Transform-domain sparsity regularization for inverse problems in geosciences, 2009, Geophysics vol. 74, No. 5, pp. R69-R83.*
Constable et al., Occam's inversion: a practical algorithm for generating smooth models from electromagnetic sounding data, 1987, Geophysics, vol. 52, No. 3, pp. 289-300.*
M. H. Loke, "Electrical imaging surveys for environmental and engineering studies, A practical guide to 2-D and 3-D surveys", 1999, pp. 1-57.*
Barker and Moore, The application of time-lapse electrical tomography in groundwater studies, 1998, The Leading Edge, 17, pp. 1454-1458.*
Alumbaugh, et al., "Image appraisal for 2-D and 3-D electromagnetic inversion", Geophysics, vol. 65(5), 2000, pp. 1455-1467.
Alumbaugh, D.L. , "Linearized and nonlinear parameter variance estimation for two-dimensional electromagnetic induction inversion", Inverse Problems, vol. 16, 2000, pp. 1323-1341.
Avis, et al., "A pivoting algorithm for convex hulls and vertex enumeration of arrangements and polyhedra", Discrete & Computational Geometry, vol. 8 (1), 1992, pp. 295-313.
Fernández-Alvarez, , "Feasibility Analysis of the Use of Binary Genetic Algorithms as Importance Samplers Application to a Geoelectrical VES Inverse Problem", Mathematical Geosciences, vol. 40 (4), 2008, pp. 375-408.

Fernández-Martínez, et al., "Particle swarm optimization applied to solving and appraising the streaming-potential inverse problem", Geophysics, vol. 75 (4), 2010, pp. WA3-WA15.
Fernández-Martínez, et al., "PSO: A powerful algorithm to solve geophysical inverse problems: Application to a 1D-DC resistivity case", Journal of Applied Geophysics, vol. 71 (1), 2010, pp. 13-25.
Fukuda, et al., "Double Description Method Revisited", Combinatorics and Computer Science, Lecture Notes in Computer Science, vol. 1120, 1996, pp. 91-111.
Ganapathysubramanian, et al., "Modeling diffusion in random heterogeneous media: Data-driven models, stochastic collocation and the variational multiscale method", Journal of Computational Physics, vol. 226 (1), 2007, pp. 326-353.
González, et al., "Seismic inversion combining rock physics and multiple-point geostatistics", Geophysics, vol. 73 (1), 2008, pp. R11-R21.
Haario, et al., "An adaptive Metropolis algorithm", Bernoulli, vol. 7 (2), 2001, pp. 223-242.
Malinverno, Alberto , "Parsimonious Bayesian Markov chain Monte Carlo inversion in a nonlinear geophysical problem", Geophysical Journal International, vol. 151 (3), 2002, pp. 675-688.
Zhang, et al., "Estimating the model resolution matrix for large seismic tomography problems based on Lanczos bidiagonalization with partial reorthogonalization", Geophysical Journal International, vol. 170 (1), 2007, pp. 337-345.
Meju, et al., "Iterative most-squares inversion: application to magnetotelluric data", Geophysical Journal International, vol. 108 (3), 1992, pp. 758-766.
Meju, M.A. , "Regularized extremal bounds analysis (REBA): An approach to quantifying uncertainty in nonlinear geophysical inverse problems", Geophysical Research Letters, vol. 36 (3), 2009, 5 pages.
Oldenburg, D.W. , "Funnel functions in linear and nonlinear appraisal", Journal of Geophysical Research: Solid Earth, vol. 88 (B9), Sep. 10, 1983, pp. 7387-7398.
Osypov, et al., "Uncertainty and Resolution Analysis for Anistropic Tomography using Iterative Eigen Decomposition", 78th Annual International Meeting, SEG, Expanded Abstracts, 2008, pp. 3244-3249.
Pearson, K. , "On lines and planes of closest fit to systems of points in space", Philosophical Magazine, vol. 2 (6), 1901, pp. 559-572.
Sambridge, et al., "Trans-dimensional inverse problems, model comparison and the evidence", Geophysical Journal International, vol. 167 (2), 2006, pp. 528-542.
Sambridge, Malcolm , "Geophysical inversion with a neighbourhood algorithm—I. Searching a parameter space", Geophysical Journal International, vol. 138 (2), 1999, pp. 479-494.
Scales, et al., "Prior information and uncertainty in inverse problems", Geophysics, vol. 66(2), Mar.-Apr. 2001, pp. 389-397.
Smolyak, S. , "Quadrature and interpolation formulas for tensor products of certain classes of functions", Soviety Mathematics, Doklady, vol. 4, 1963, pp. 240-243.
Tarantola, et al., "Inverse Problems=Quest for Information", Journal of Geophysics, vol. 50, 1982, pp. 159-170.
Xiu, et al., "High-Order Collocation Methods for Differential Equations with Random Inputs", SIAm J. Sci. Comput. vol. 27 (3), 2005, pp. 1118-1139.
International Search Report and Written Opinion issued in PCT/US/2011/028385 on Sep. 28, 2011, 8 pages.

* cited by examiner

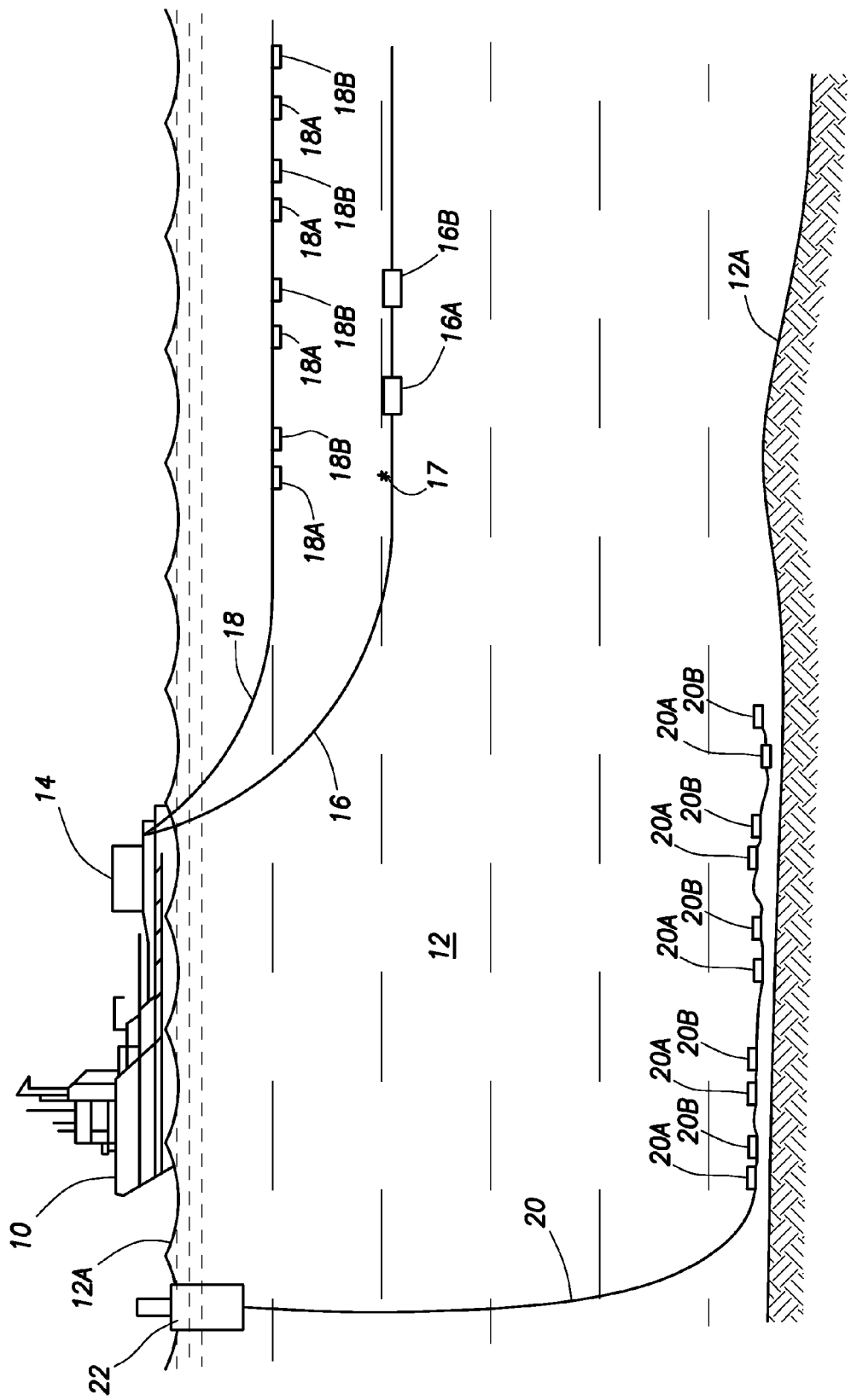

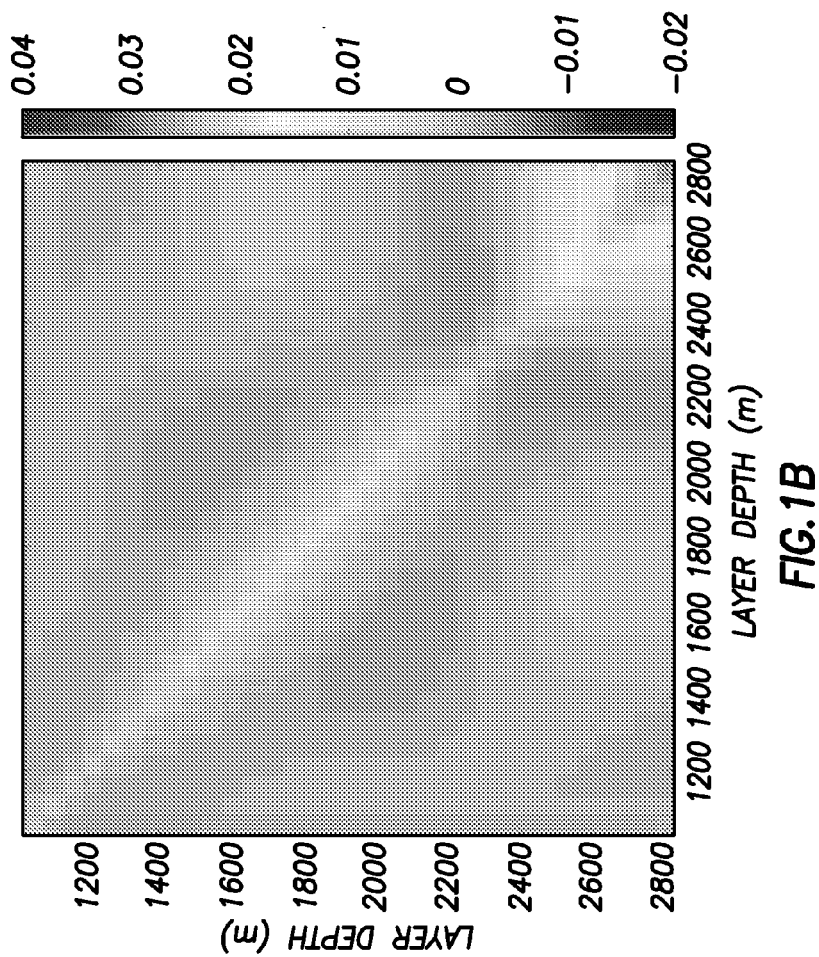
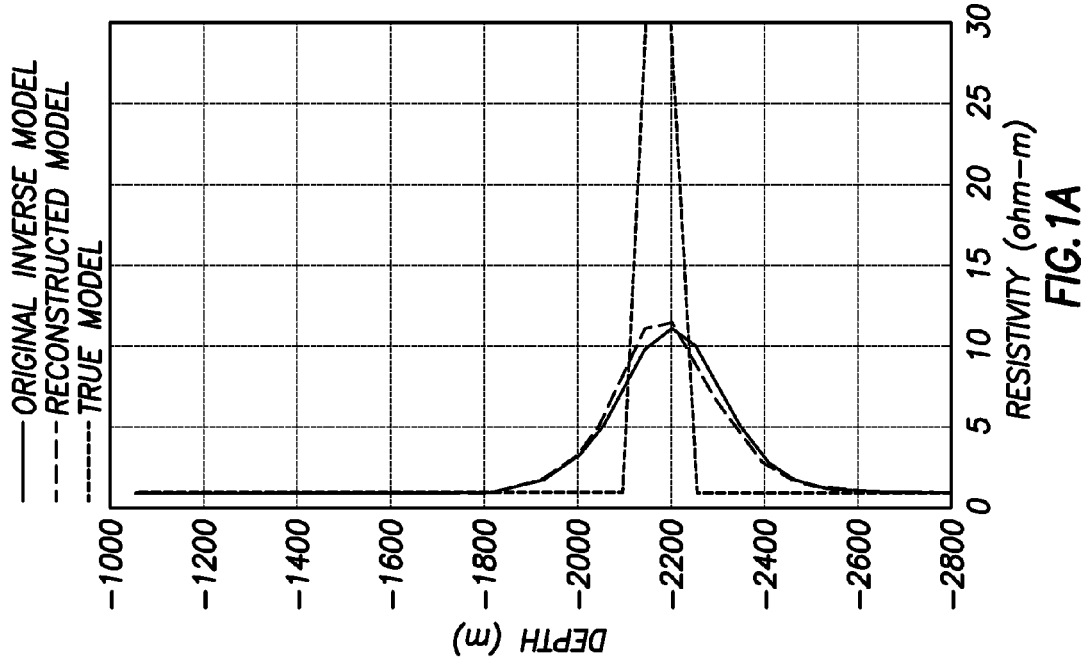
FIG. 1B
FIG. 1A

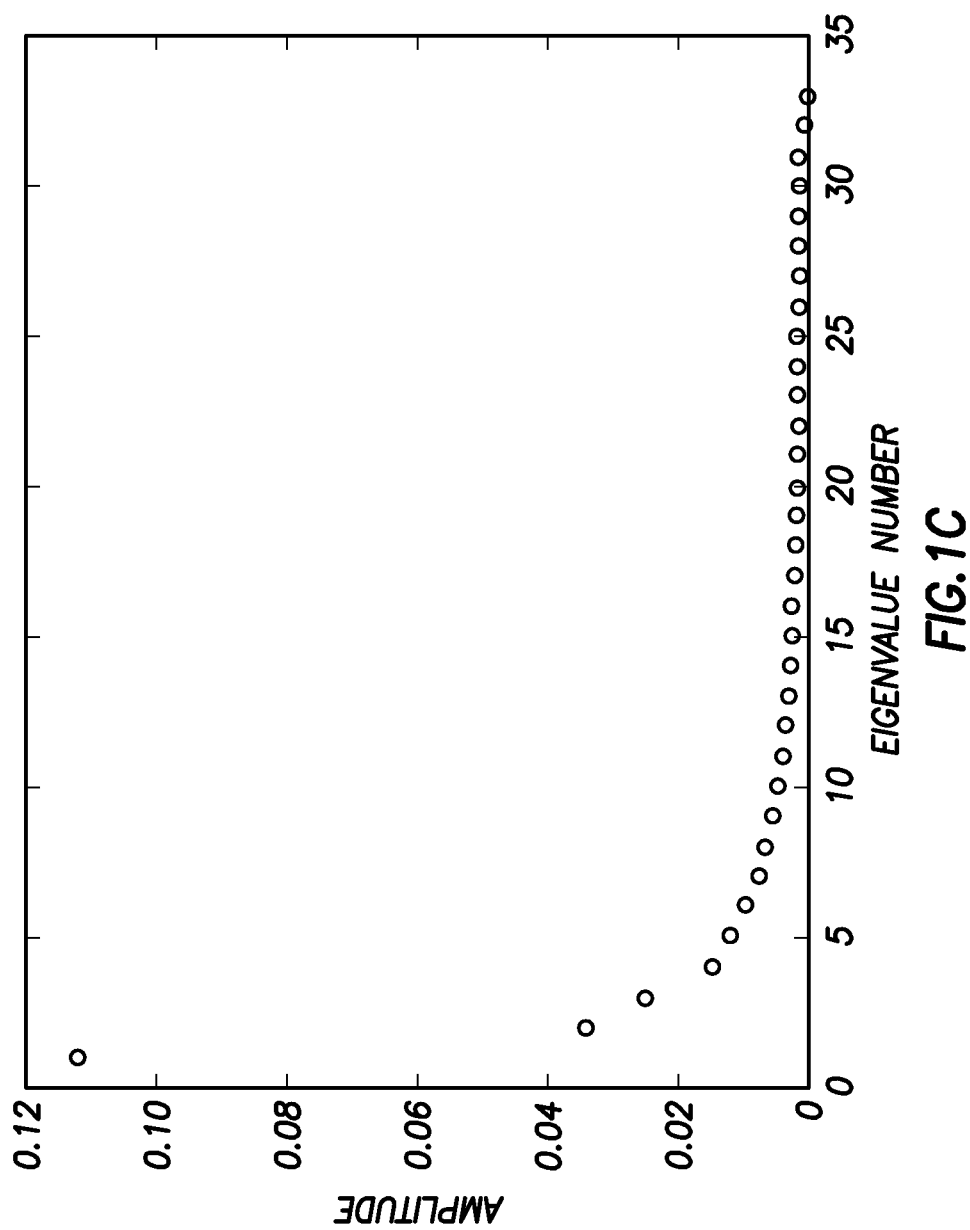

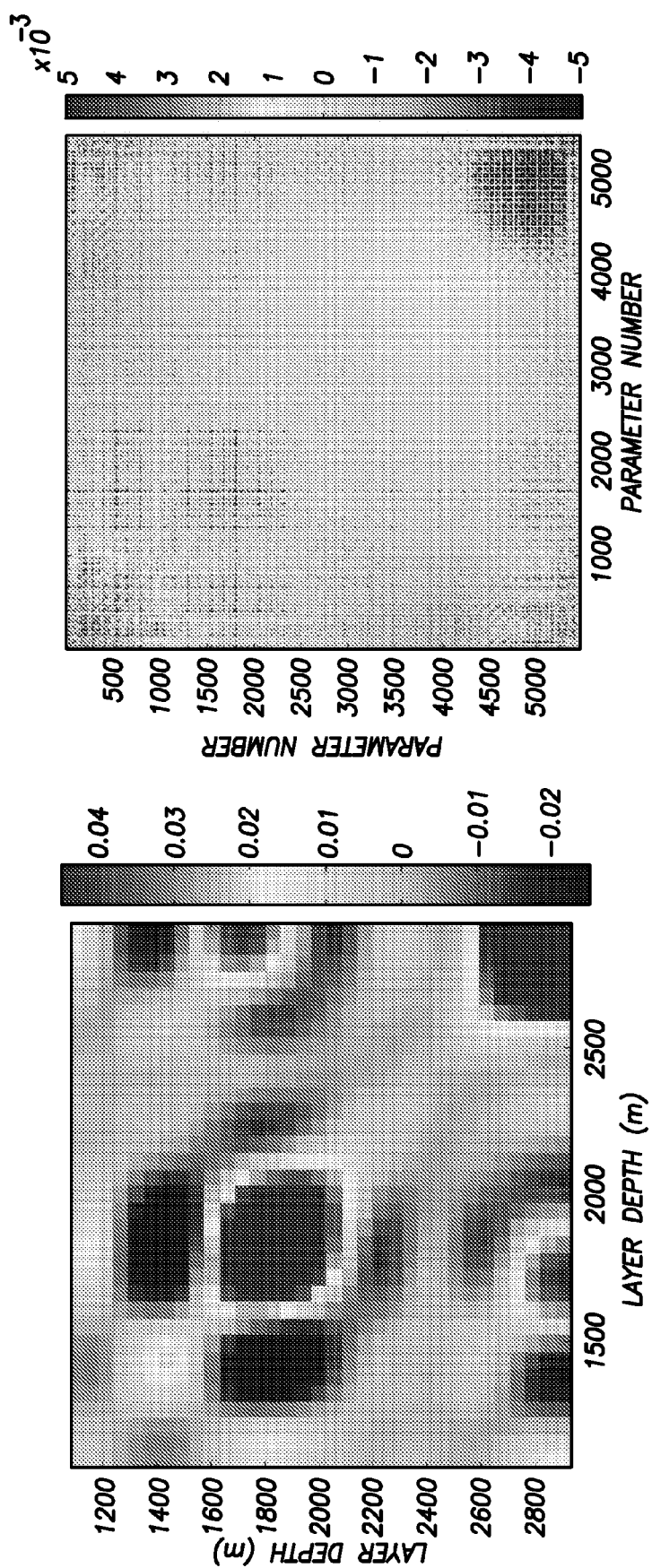

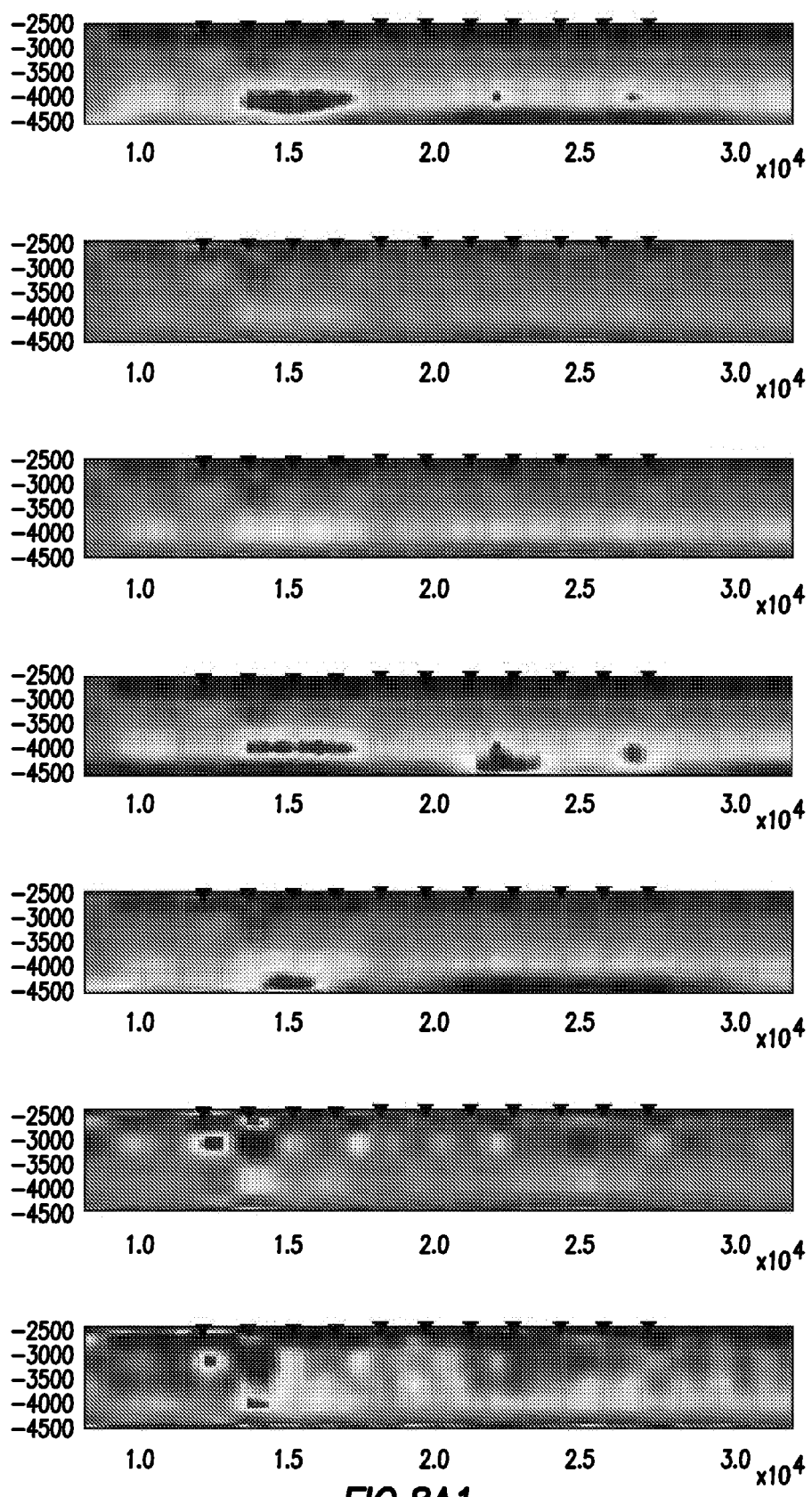
FIG.8A1

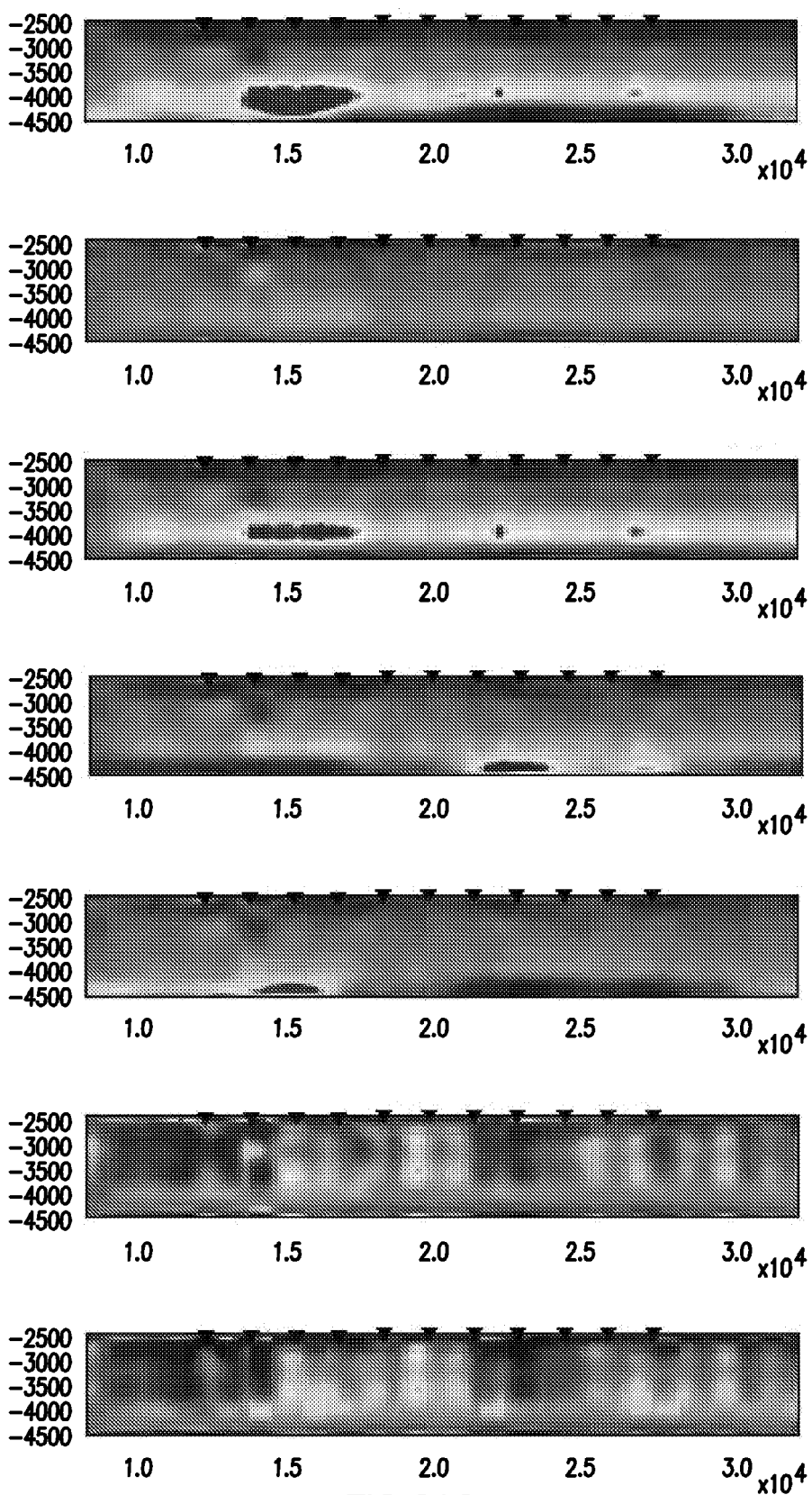
FIG.8A2

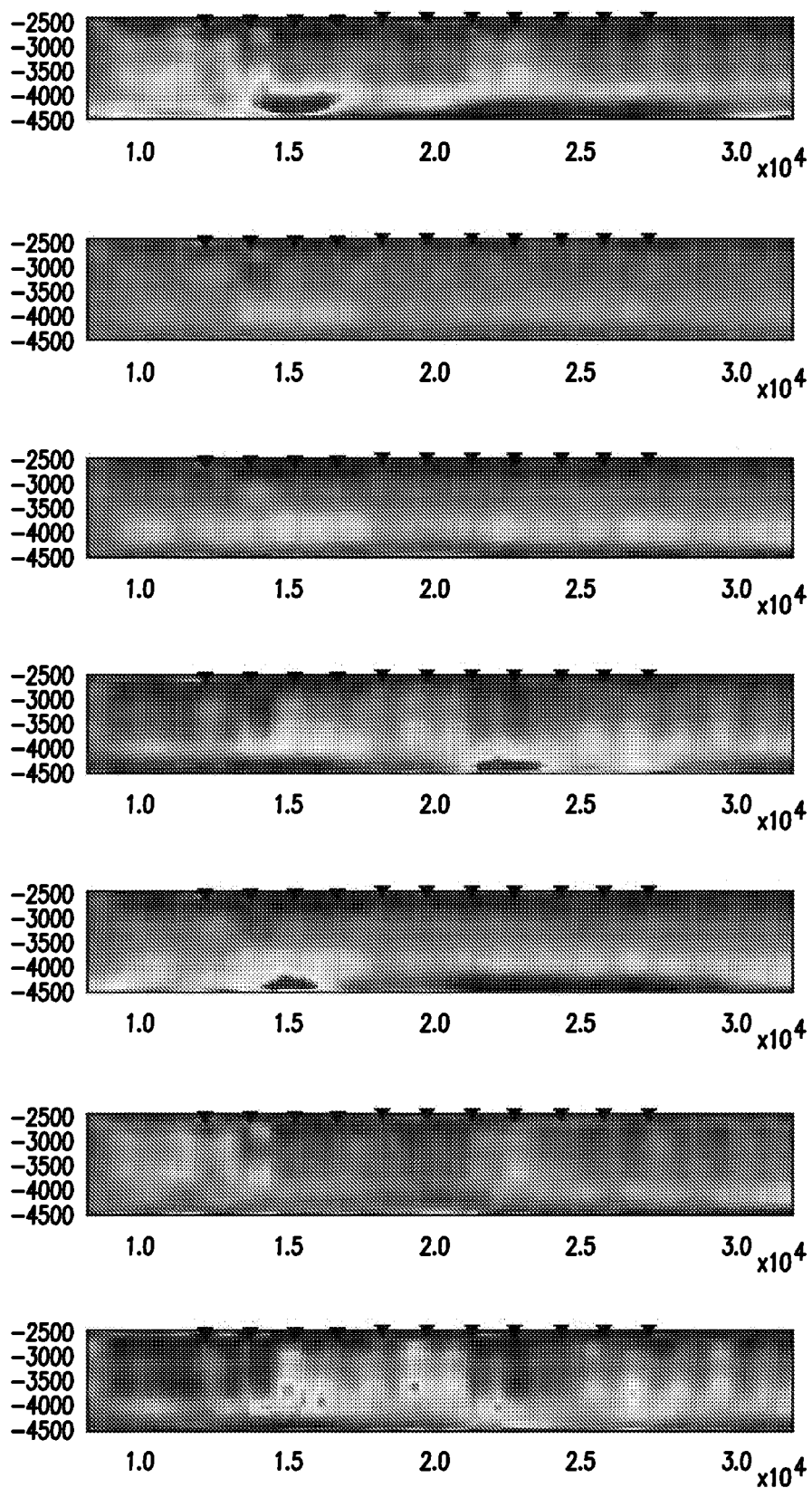
*FIG.8B1*

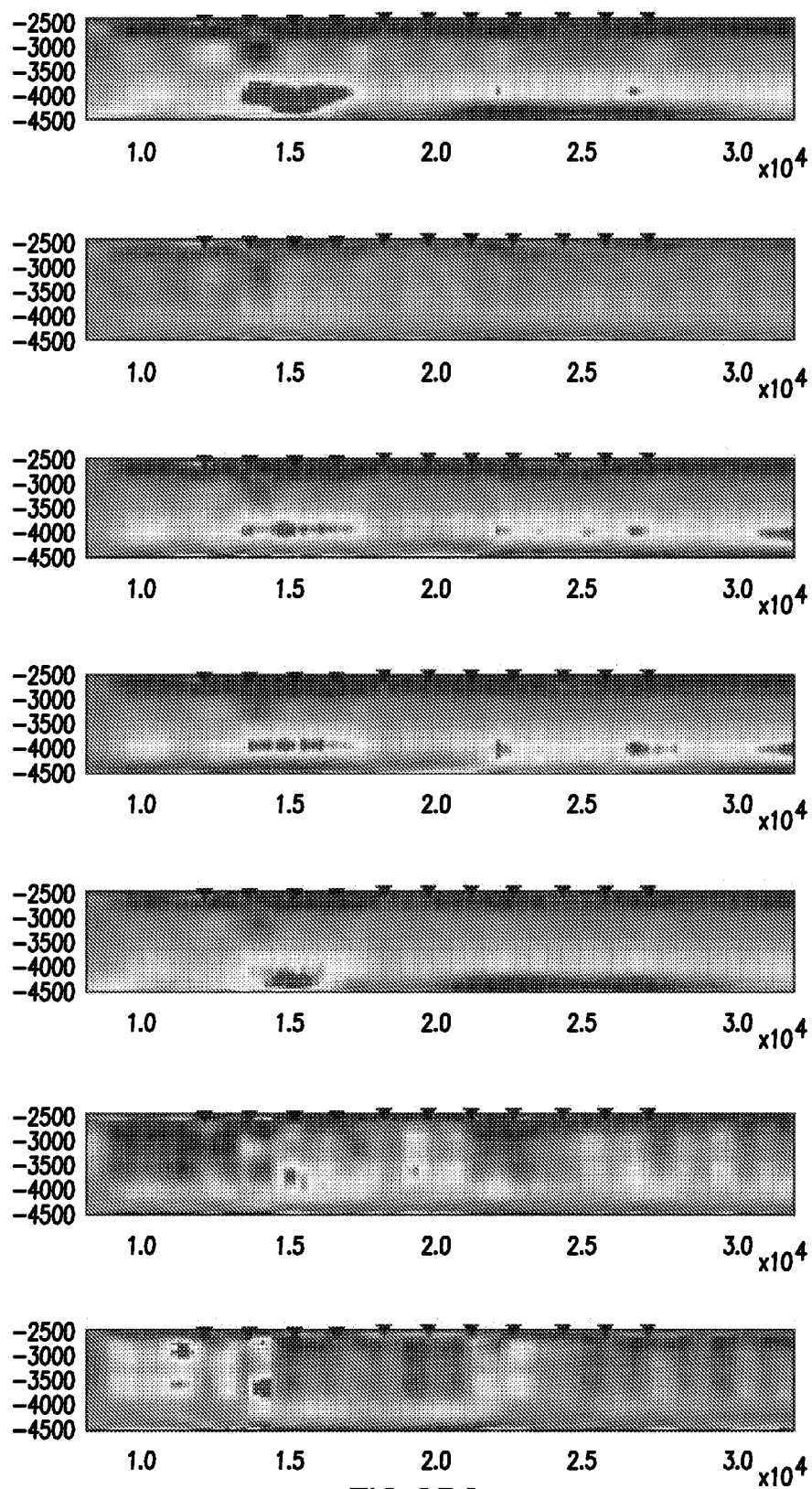
FIG.8B2

UNCERTAINTY ESTIMATION FOR LARGE-SCALE NONLINEAR INVERSE PROBLEMS USING GEOMETRIC SAMPLING AND COVARIANCE-FREE MODEL COMPRESSION

CROSS-REFERENCE TO RELATED APPLICATIONS

Priority is claimed from U.S. Provisional Application No. 61/315,644 filed on Mar. 19, 2010.

STATEMENT REGARDING FEDERALLY SPONSORED RESEARCH OR DEVELOPMENT

Not applicable.

BACKGROUND OF THE INVENTION

Field of the Invention

The invention relates generally to the field of determining subsurface geologic structures and formation composition (i.e., spatial distribution of one or more physical properties) by inversion processing of geophysical measurements. More particularly, the invention relates to methods for determining uncertainty in inversion results.

Background Art

In the present description of the Background of the Invention and in the Detailed Description which follows, references to the following documents are made:

Alumbaugh, D. L., and G. A. Newman, 2000, *Image appraisal for 2-D and 3-D electromagnetic inversion*, Geophysics, 65, 1455-1467.

Alumbaugh, D. L., 2002, *Linearized and nonlinear parameter variance estimation for two-dimensional electromagnetic induction inversion*, Inverse Problems, 16, 1323-1341.

Avis, D., and K. Fukuda, 1992, *A pivoting algorithm for convex hulls and vertex enumeration of arrangements and polyhedra*, Journal Discrete Comp. Geometry, 8, 295-313.

Fernández-Álvarez, J. P., J. L. Fernández-Martínez, and C. O. Menéndez-Pérez, 2008, *Feasibility analysis of the use of binary genetic algorithms as importance samplers application to a geoelectrical VES inverse problem*, Mathematical Geosciences, 40, 375-408.

Fernández-Martínez, J. L., E. García-Gonzalo, J. P. F. Álvarez, H. A. Kuzma, and C. O. Menéndez-Pérez, 2010a, *PSO: A powerful algorithm to solve geophysical inverse problems: Application to a 1D-DC Resistivity Case*, Journal of Applied Geophysics, Accepted.

Fernández-Martínez, J. L., E. García-Gonzalo, and V. Naudet, 2010b, *Particle swarm optimization applied to the solving and appraisal of the streaming potential inverse problem*, Geophysics, Hydrogeophysics Special Issue, Accepted.

Fukuda, K., and A. Prodon, 1996, *Double description method revisited*, in M. Deza, R. Euler, and I. Manoussakis, eds., Combinatorics and Computer Science-Lecture Notes in Computer Science: Springer-Verlag, 1120, 91-111.

Ganapathysubramanian, B., and N. Zabaras, 2007, *Modeling diffusion in random heterogeneous media: Data-driven models, stochastic collocation and the variational multiscale method*, J. Comp. Physics, 226, 326-353.

González, E. F., T. Mukerji, and G. Mavko, 2008, *Seismic inversion combining rock physics and multiple point geostatistics*, Geophysics, 73, no. 1, R11-R21.

Haario, H., E. Saksman, and J. Tamminen, 2001, *An adaptive Metropolis algorithm*, Bernoulli, 7, 223-242.

Jolliffe, I. T., 2002, *Principal Component Analysis*, 2nd ed.: Springer, New York.

Malinverno, A., 2002, *Parsimonious Bayesian Markov chain Monte Carlo inversion in a nonlinear geophysical problem*, Geophys. J. Int., 151, 675-688.

Matarese, J. R., 1995, *Nonlinear traveltime tomography*: Ph.D. thesis, MIT.

Meju, M. A., and V. R. S. Hutton, 1992, *Iterative most-squares inversion: application to magnetotelluric data*, Geophys. J. Int., 108, 758-766.

Meju, M. A., 1994, *Geophysical data analysis: understanding inverse problem theory and practice*, Course Notes: Society of Exploration Geophysicists, Tulsa.

Meju, M. A., 2009, *Regularized extremal bounds analysis (REBA): an approach to quantifying uncertainty in nonlinear geophysical inverse problems*, Geophys. Res. Lett., 36, L03304.

Oldenburg, D. W., 1983, *Funnel functions in linear and nonlinear appraisal*, J. Geophys. Res., 88, 7387-7398.

Osypov, K., D. Nichols, M. Woodward, O. Zdraveva, and C. E. Yarman, 2008, *Uncertainty and resolution analysis for anisotropic tomography using iterative eigen decomposition*, 78th Annual International Meeting, SEG, Expanded Abstracts, 3244-3249.

Pearson, K., 1901, *On lines and planes of closest fit to systems of points in space*, Phil. Mag., 2, no. 6, 559-572.

Sambridge, M., 1999, *Geophysical inversion with a neighborhood algorithm-I. Searching a parameter space*, Geophys. J. Int., 138, 479-494.

Sambridge, M., K. Gallagher, A. Jackson, and P. Rickwood, 2006, *Trans-dimensional inverse problems, model comparison and the evidence*, Geophys. J. Int., 167, 528-542, doi:10.1111/j.1365-246X.2006.03155.xScales, J. A., and L. Tenorio, 2001, *Prior information and uncertainty in inverse problems*, Geophysics, 66, 389-397.

Sen, M., and P. L. Stoffa, 1995, *Global Optimization Methods in Geophysical Inversion*: Elsevier Press, New York.

Smolyak, S., 1963, *Quadrature and interpolation formulas for tensor products of certain classes of functions*, Doklady Mathematics, 4, 240-243.

Tarantola, A., and B. Valette, 1982, *Inverse problems-quest for information*, Journal of Geophysics, 50, 159-170.

Tarantola, A., 2005, *Inverse Problem Theory*: SIAM Press, Philadelphia.

Tompkins, M. J, 2003, *Quantitative analysis of borehole electromagnetic induction logging responses using anisotropic forward modeling and inversion*: PhD thesis, University of Wisconsin-Madison.

Xiu, D., and J. S. Hesthaven, 2005, *High-order collocation methods for differential equations with random inputs*, SIAM J. of Sci. Comp., 27, 1118-1139.

Zhang, H., and C. H. Thurber, 2007, *Estimating the model resolution matrix for large seismic tomography problems based on Lanczos bidiagonalization with partial reorthogonalization*, Geophys. J. Int., 170, 337-435.

When solving geophysical problems, often the focus is on a complete solution to a particular inverse problem given a preferred inversion processing technique and any available knowledge of the geology (i.e., the structure and composition of the subsurface formations being evaluated). However, there is always the ancillary problem of quantifying how uncertain it is that the particular solution obtained is unique, or is even the best solution consistent with the actual geology (i.e., the actual spatial distribution of rock formations and corresponding physical properties in the subsurface). There are a number of reasons for uncertainty in inversion results, the most important of which are physical parameter measurement error, inversion solution non-uniqueness, density of the physical parameter measurements within a selected inversion volume ("data coverage") and bandwidth limitation, and physical assumptions (e.g., isotropy) or approximations (numerical error). In the context of nonlinear inversion, the uncertainty problem is that of quantifying the variability in the model space supported by prior information and measured geophysical and/or petrophysical data. Because uncertainty is present in all geophysical inversion solutions, any geological interpretation made using inversion should include an estimate of the uncertainty. This is not typically the case, however. Rather, nonlinear inverse uncertainty remains one of the most significant unsolved problems in geophysical data interpretation, especially for large-scale inversion problems.

There are some methods known in the art for estimating inverse solution uncertainties (See Tarantola, 2005); however, these methods have been shown to be deficient for large-scale nonlinear inversion problems. As explained in Meju (2009), perhaps the most apparent distinction is between deterministic and stochastic methods. Deterministic methods seek to quantify inversion uncertainty based on least-squares inverse solutions and the computation of model resolution and covariance (e.g., Osypov et al., 2008; Zhang and Thurber, 2007) or by extremal solutions (e.g., Oldenburg, 1983; Meju, 2009), while stochastic methods seek to quantify uncertainty by presenting a problem in terms of random variables and processes and computing statistical moments of the resulting ensemble of solutions (e.g., Tarantola and Valette, 1982; Sambridge, 1999; Malinverno, 2002). Commonly, deterministic methods rely on linearized estimates of inverse model uncertainty, for example, about the last iteration of a nonlinear inversion, and thus, have limited relevance to actual nonlinear uncertainty (e.g., Meju, 1994; Alumbaugh, 2002). Stochastic uncertainty methods, which typically use random sampling schemes in parameter space, avoid burdensome inversions and account for nonlinearity but often come at the high computational cost of a very large number of forward solutions (Haario et al., 2001).

Other researchers have extended deterministic techniques or combined them with stochastic methods. Meju and Hutton (1992) presented an extension to linearized uncertainty estimation for magnetotelluric (MT) problems by using an iterative most-squares solution; however, due to its iterative extremizing of individual parameters, this method is practical only for small parameter spaces. Another approach has been to use the computational efficiency of deterministic inverse solutions and incorporate nonlinearity by probabilistic sampling (e.g., Materese, 1995; Alumbaugh and Newman, 2000; Alumbaugh, 2002). In essence, the foregoing hybrid method involves solving either a portion or the entire nonlinear inverse problem many times, while either the observations or prior model are treated as random variables. Such quasi-stochastic uncertainty method is able to account for at least a portion of the nonlinear uncertainty of geophysical inverse problems, but random sampling can be computationally inefficient and involves at least hundreds of inverse solutions (Alumbaugh, 2002) for only modest-sized problems.

The problem of uncertainty has a natural interpretation in a Bayesian framework (See Scales and Tenorio, 2001) and is very well connected to the use of sampling and a class of global optimization methods where the random search is directed using some fitness criteria for the estimates. Methods such as simulated annealing, genetic algorithm, particle swarm, and neighborhood algorithm belong to this category, and these can be useful for nonlinear problems (e.g., Sen and Stoffa, 1995; Sambridge, 1999; Fernández Alvarez et al., 2008; Fernández Martínez et al., 2010a,b). These stochastic methods avoid having to solve the large-scale inverse problem directly, account for problem nonlinearity, and produce estimates of uncertainty; however, they do not avoid having to sample the correspondingly massive multivariate posterior space (e.g., Haario et al., 2001). While this has limited the use of global optimization to nonlinear problems of modest size, recent work by Sambridge et al. (2006) suggests that extensions to somewhat larger parameterizations may be possible if parameter reduction is performed by optimization. Because most practical geophysical parameterizations consist of thousands to billions of unknowns, stochastic sampling of the entire model space is, at best, impractical. So, this begs the question: how can we reduce the computational burden of posterior sampling methods without limiting our uncertainty estimations to inaccurate linearizations?

We address this by presenting an alternative nonlinear scheme that infers uncertainty from sparse posterior sampling in bounded reduced-dimensional model spaces (Tompkins and Fernández Martínez, 2010). We adapt this method from Ganapathysubramanian and Zabaras (2007), who used it to solve the stochastic forward problem describing thermal diffusion through random heterogeneous media. The foregoing researchers showed that they could dramatically improve the efficiency of stochastic sampling if they combined model parameter reduction, parameter constraint mapping, and sparse deterministic sampling using a Smolyak scheme. Specifically, they computed model covariances from a statistical sampling of material properties (microstructures), and used Principal Component Analysis (PCA) to decorrelate and reduce their over-parameterized model domain by orders of magnitude. They then mapped parameter constraints, given statistical properties from the original model domain, to this reduced space, using a linear programming scheme. This was necessary, because they did not use the reduced base to restrict the values of parameters (only to restrict their spatial correlations). Ganapathysubramanian and Zabaras (2007) demonstrated that the bounded region defined in the reduced space was a "material" plane of equal probability and could be sampled to solve the forward stochastic thermal diffusion problem. While this method worked well for their forward problem, where the material property statistics are known, it is insufficient to solve the nonlinear inverse uncertainty problem. Here, we adapt this method to the geophysical uncertainty problem.

SUMMARY OF THE INVENTION

A method according to one aspect of the invention for uncertainty estimation for nonlinear inverse problems includes obtaining an inverse model of spatial distribution of a physical property of subsurface formations. A set of possible models of spatial distribution is obtained based on the measurements. A set of model parameters is obtained. The number of model parameters is reduced by a covariance-free compression transform. Upper and lower limits of a value of the physical property are mapped to an orthogonal space. A model polytope including a geometric region of feasible models is defined. At least one of random and geometric sampling of the model polytope is performed in a reduced-dimensional space to generate an equi-feasible ensemble of models. The reduced-dimensional space is approximated by a hypercube. Highly probable (i.e., equivalent) model samples are evaluated based on numerical simulation and data misfits from among an equi-feasible model ensemble determined by initial inversion result. Final uncertainties are determined from the equivalent model ensemble and the final uncertainties are displayed in at least one map.

Other aspects and advantages of the invention will be apparent from the following description and the appended claims.

BRIEF DESCRIPTION OF THE DRAWINGS

FIG. 1 shows an example of acquisition of electromagnetic geophysical data that may be processed according to the present invention.

FIG. 1A shows a true earth model, original resistivity inverse model, and reconstructed inverse model based on only three eigenvectors.

FIG. 1B shows a linearized covariance matrix computed from the inverse model in FIG. 1A and used for PCA.

FIG. 1C shows Eigenvalues computed for the covariance matrix in FIG. 1B and used to select the most important (i.e., four) eigenvectors for model compression and sampling.

FIG. 2A shows an original field data resistivity inverse model. FIG. 2B shows a compressed image using model-based singular value decomposition (SVD) showing the most important (i.e., largest) model vectors (columns). The lines indicate the largest 6 and 9 columns which account for 81 and 90% of the model variability, respectively. FIG. 2C shows a reconstructed model using only the first 6 orthogonal basis matrices.

FIG. 4A shows sparse 99 equi-feasible models. FIG. 4B shows the 61 equivalent models. FIG. 4C shows a comprehensive sampling directly from the posterior polytope in the reduced space. The true model (dotted black), inverse model (bold black), and example multi-resistor model are also shown.

FIGS. 5A through 5C show gray scale model covariance matrices ($S^2/m^2$). Axes show 33 layer depths (m). The diagonals are layer variances, and off-diagonals are covariances. FIG. 5A shows linear covariance as in FIG. 1B. FIG. 5B shows non-linear covariance inferred from sparse hypercube ensemble. FIG. 5C shows non-linear covariance inferred from exhaustive vertex-sampled ensemble.

FIGS. 6A and 6B show 2D CSEM gray scale model covariance matrices ($S^2/m^2$). FIG. 6A shows a nonlinear covariance matrix computed directly from the equivalent model ensemble (FIGS. 8A1, 8A2, 8B1 and 8B2). FIG. 6B shows a linearized covariance matrix as computed from equation 2 about the last iteration of the inverse model from FIG. 2A FIGS. 7A and 7B show results of Principal Component Analysis (PCA) using the 2D linear model covariance matrix and 2D inverse model. FIG. 7A shows the first 1000 eigenvalues (~50% of the total variance) computed for the linear model covariances in FIG. 6B.

FIGS. 8A1, 8A2, 8B1 and 8B2 show example 2D resistivity earth models taken from the equi-feasible model ensemble generated for the uncertainty problem. Various classes of models are represented including some a-geologic examples.

FIG. 11A is the original inverse model. FIG. 11B is a map of all resistivities with a probability of occurrence greater than P(10). FIG. 11C is a map of all resistivities with a probability of occurrence greater than P(50). FIG. 11D is a map of all resistivities with a probability of occurrence greater than P(90).

DETAILED DESCRIPTION

Figure 2A:
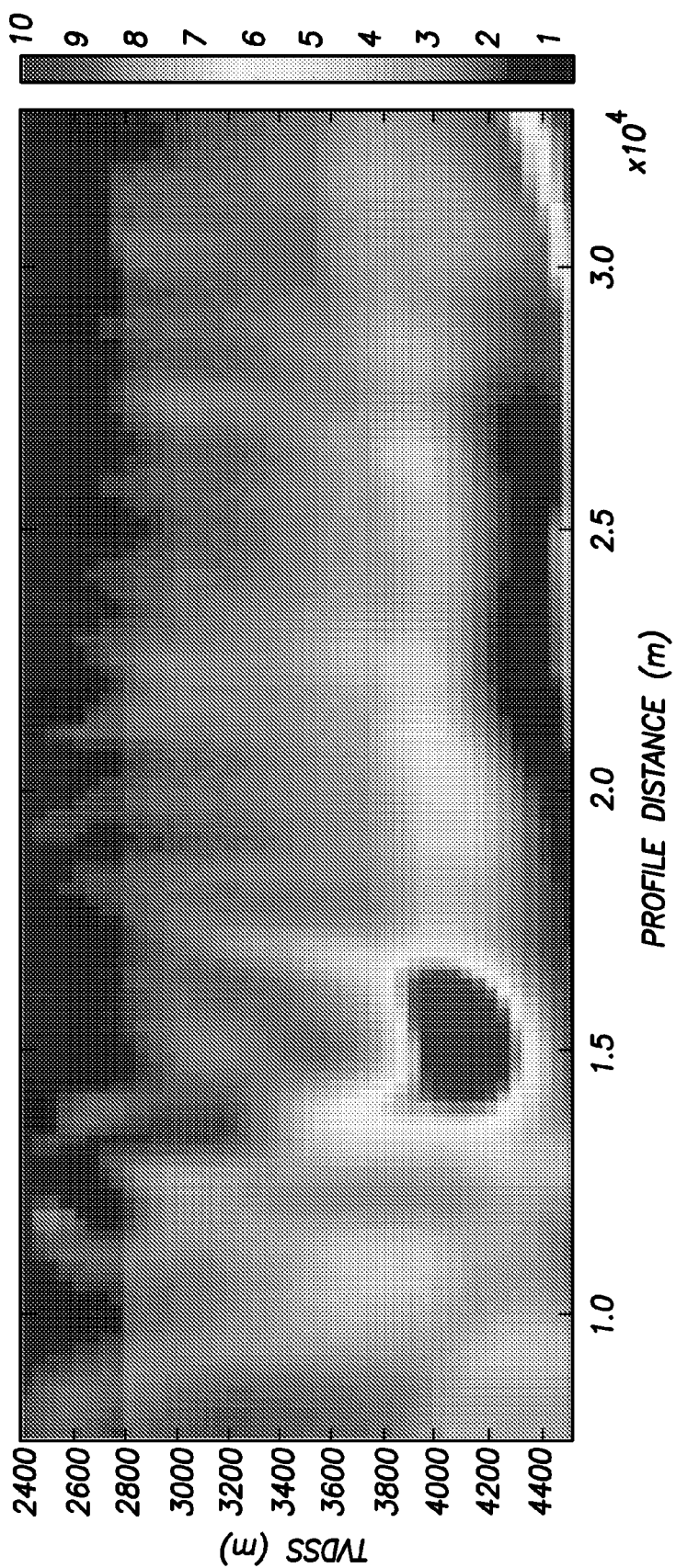
FIGS. 2A through 2C show an example 2D inverse model (43×127 cells) used for model compression and uncertainty estimation.

FIG. 1 shows an example marine electromagnetic survey system that may acquire controlled source electromagnetic survey (CSEM) signals for processing according to the invention. The system may include a survey vessel 10 that moves along the surface 12A of a body of water 12 such as a lake or the ocean. The vessel 10 may include thereon equipment, referred to for convenience as a "recording system" and shown generally at 14, for generating electromagnetic fields to be imparted into formations 24 below the bottom of the water 12 and for recording measurements made in response to the imparted electromagnetic fields. The recording system 14 may include (none shown separately for clarity of the illustration) navigation devices to determine the geodetic position of the vessel 10. The vessel may include further equipment for determining geodetic position and/or heading of one or more electromagnetic transmitters and receivers (described below), devices for imparting electric current to the transmitter(s); and data storage equipment for recording signals detected by the one or more electromagnetic receivers.

The electromagnetic transmitter in the present example may be a bipole electrode, shown as a pair of electrodes at 16A, 16B disposed along an electrical cable 16 towed by the vessel 10. At selected times, the recording system 14 may pass electric current through the electrodes 16A, 16B. The current may be continuous at one or more discrete frequencies or may be configured to induce transient electromagnetic fields in the formations 24 below the water bottom 12A. Examples of such current include switched direct current, wherein the current may be switched on, switched off, reversed polarity, or switched in an extended set of switching events, such as a pseudo random binary sequence ("PRBS") or other coded sequence.

In the present example, the vessel 10 may tow one or more receiver cables 18 having thereon a plurality of electromagnetic receivers, such as bipole electrodes 18A, 18B, disposed at spaced apart positions along the cable. The bipole electrodes 18A, 18B will have voltages imparted across them related to the amplitude of the electric field component of the electromagnetic field emanating from the formations 24 in response to the imparted electromagnetic field. The recording system 14 on the vessel 10 may include, as explained above, devices for recording the signals generated by the electrodes 18A, 18B. The recording of each receiver's response is typically indexed with respect to a reference time, such as a current switching event in the transmitter current. A sensor 17 such as a magnetic field sensor (e.g., a magnetometer) or current meter may be disposed proximate the transmitter as shown and may be used to measure a parameter related to the amount of current flowing through the transmitter.

In the present example, in substitution of or in addition to the receiver cable 18 towed by the vessel 10, a water bottom receiver cable 20 may be disposed along the bottom of the water 12, and may include a plurality of receivers such as bipole electrodes 20A, 20B similar in configuration to the bipole electrodes 18A, 18B on the towed cable. The electrodes 20A, 20B may be in signal communication with a recording buoy 22 or similar device either near the water surface 12A or on the water bottom that may record signals detected by the electrodes 20A, 20B.

It will be appreciated by those skilled in the art that the invention is not limited in scope to the transmitter and receiver arrangements shown in FIG. 1. Other examples may use, in substitution of or in addition to the bipole electrodes shown in FIG. 1, wire coils or wire loops for the transmitter to impart a time varying magnetic field into the formations 24. The receiver cables 18, 20 may include other sensing devices, such as magnetometers, wire loops or coils to detect the magnetic field component of the induced electromagnetic field from the formation 24.

The receivers may be generally disposed along a common line with the transmitter during signal recording. Recordings of signals from each of the respective receivers may be made with the transmitter disposed at selected locations along the common line and actuated as explained above. The recorded signal corresponding to each electromagnetic receiver will be associated with a distance, called "offset", that is located at the geodetic midpoint between the receiver geodetic position and the geodetic position of the transmitter at the time of signal recording. Thus, signals corresponding to a plurality of offsets may be acquired.

The above example is provided to show one type of data that may be processed by example methods according to the invention. The method of the invention is not to be construed as limited to processing such type of data. Further, the data may be processed according to the invention separately from acquisition of the data. Consequently, the scope of the invention is not limited to performing both the acquisition and the processing to be explained below. Where so noted in the present description, a referenced document from the list provided in the Background section herein may provide an example of possible techniques for performing specified elements of methods according to the invention. Unless so noted, and the referenced documents is incorporated herein by reference, the cited document is only meant to provide enabling, but not limiting, example techniques of the described method of the element(s)

An example method according to the present invention has four principal steps: model domain reduction, parameter constraint mapping, sparse sampling, and forward evaluation. The process may start with some a priori information about the model domain (e.g., linearized model covariances or a single inverse solution) and use the associated parameter correlations to reduce the dimension of the model domain. Next, define a region of feasibility is defined within this reduced space. However, the statistical properties of the model posterior are not known, so a region of equal feasibility (i.e., uniform prior) may be defined based on a priori parameter constraints in the original model space these bound are mapped to the reduced space. This constraint mapping generates a bounded convex region (the posterior polytope) that has a generally complex geometric shape, which may be approximated with a hypercube. Such approximation enables use of sparse interpolation grids to sample this feasible model region. In this way, the posterior is characterized by "geometric sampling" over the reduced model space. Finally, since these model samples are only feasible, forward evaluations are used to determine which of the model samples are likely. Unlike other global sampling methods, the present posterior model samples are pre-determined and de-coupled from forward evaluations (i.e., model likelihoods). This enables drawing samples from the posterior model space, all at once, and optimizing for the sparsest posterior sampling set required for convergence of uncertainty measures. In effect, the nonlinear equivalence space is represented with a minimum number of forward evaluations. The resulting ensemble of models is an optimally sparse representation of the posterior model space defined by priori information and parameter correlation structures. The uncertainty of the inverse problem then can be explored through either the model ensemble itself or statistical measures (e.g., mean, covariance, indicator probability, etc.) computed from its distribution.

An example method according to the invention begins with a single solution, $m_f$, to some nonlinear inverse problem (e.g., as shown in FIGS. 1A through 1C and FIGS. 2A through 2C). The model parameter vector is one of many, $m \in M \subset R^N$, where M is the subset (within an N-dimensional model space) of all feasible models formulated in terms of geological consistency. To solve the nonlinear uncertainty problem, it is necessary to find a set of equivalent models belonging to the subset M that are consistent with the observed data (e.g., geophysical measurements such as CSEM measurements made as explained with reference to FIG. 1) $d \in R^m$ within a defined or predetermined tolerance (tol):

$$\|F(m)-d\|_p < \text{tol} \qquad (1)$$

F(m) in equation (1) represents predictions made with respect to the measured data, d, and $\|\cdot\|_p$ represents the data misfit norm. Once a representative set of equivalent forward models is determined, which may be referred to as "equivalent" models, one may either calculate statistical properties of the set of equivalent models or use the equivalent models directly to evaluate nonlinear inverse solution uncertainty.

1. PRINCIPAL COMPONENT ANALYSIS

Principal Component Analysis (Pearson, 1901) (PCA) is a mathematical procedure that transforms, in an optimal way, a number of correlated variables (i.e., model parameters in the present case) into an equal number of uncorrelated variables, called principal components, while maintaining their full variance and ordering the principal components by their contribution. The resulting transformation is such that the first principal component represents the largest amount of variability, while each successive principal component accounts for as much of the remaining variability as possible. One example of the foregoing procedure is the discrete Karhunen-Loève transform (KLT), and it is one of the most useful techniques in evaluation analysis. KLT is typically performed on the model covariance matrix, $C^{lin}$ (Jolliffe, 2002). However, the KLT procedure can also be performed on the model itself when parameterizations are too large for practical computation of the covariance matrix $C^{lin}$. In both such cases, the number of model parameters can be reduced by replacing them with the first few principal components, based on relative amplitudes, that capture most of the model variance. In essence, PCA consists of finding a reduced-dimensional orthogonal base, consistent with correlations in the inverse model, which can be used as a new model parameter base.

Covariance-Based PCA

If the parameterization is not too large, it is possible to perform the PCA using a deterministic inverse solution, $m_f$, as an estimate of the mean model, $\mu_m$, and computing the linearized prior model covariance matrix:

$$[C^{lin}] = \sigma^2 [J_{m_f}^T J_{m_f}]^{-1}. \qquad (2)$$

Equation 2 assumes: (i) no solution bias (i.e., no regularization term); (ii) independent data errors of equal variance, $\sigma^2$; and (iii) a Jacobian, $J_{m_f}$, computed at the last iteration of the inversion procedure. The covariance matrix, $C^{lin}$, is symmetric and semi-definite positive, so computation of the principal components reduces to the eigenvalue problem (Jolliffe, 2002) for N model parameters:

$$C^{lin} v_i = \lambda_i v_i, \qquad (3)$$

where $\lambda_i$ are the eigenvalues, and the N eigenvectors (i.e., principal components), $v_i$, constitute an orthogonal base. It is then desirable to select the smallest subset of vectors from the orthogonal base which adequately account for the model variability. Thus, one may select the d<<N eigenvectors that represent most of the variance in the model, e.g., 70 percent or more as in the following expression:

$$\frac{\sum \lambda(1:d)}{\sum \text{diag}[C^{lin}]} > 0.70. \qquad (4)$$

An example of this type of eigenvalue decomposition is shown in FIGS. 1A through 1C for a simple one dimensional marine CSEM model. In the present example, 70-90% of the variation in the model covariances is represented by only 4-8 independent eigenvectors.

2. MODEL-BASED COVARIANCE FREE COMPRESSION TRANSFORM

PCA as described above may be impracticable for use in cases where the model parameterization is large or it is otherwise impracticable to compute the model covariance matrix. In methods according to the present invention, it has been determined that the equivalent of PCA may be extended to any 2D rectangular model matrix using a covariance free transform, for example, singular value decomposition (SVD). In this case, one can compute the mean of the inverse image, $\mu_f$, and factorize the residual model ($m_r = m_f - \mu_f$) itself as:

$$m_r(r,c) = USV^T, \qquad (5)$$

where S is the singular values matrix, and U and V are the left and right singular vector matrices of $m_r$, and also contain the orthogonal bases for its rows (dim=r) and columns (dim=c), respectively. Once these bases are calculated, the image, $m_r$, may be projected onto one or the other (depending on which dimension is desired to be compressed in the model) as follows:

$$U_{image} = U^T m_r. \qquad (6)$$

The intent of the foregoing transform is to decorrelate and compress the image to the d first rows of $U_{image}$ corresponding to most of its variability about the mean. If a thresholding matrix, $T_i$, is then defined as a zero matrix with the dimensions of $U_{image}$ and containing only its ith row, $$T_i(j,:) = U_{image}(j,:) \cdot \delta_{ji}, j=1, \ldots r, \qquad (7)$$

it is then possible to reduce the dimension of the model space by projecting the first d threshold matrices back onto their corresponding base, U:

$$v_i = UT_i, i=1, \ldots d. \qquad (8)$$

Figure 2B:
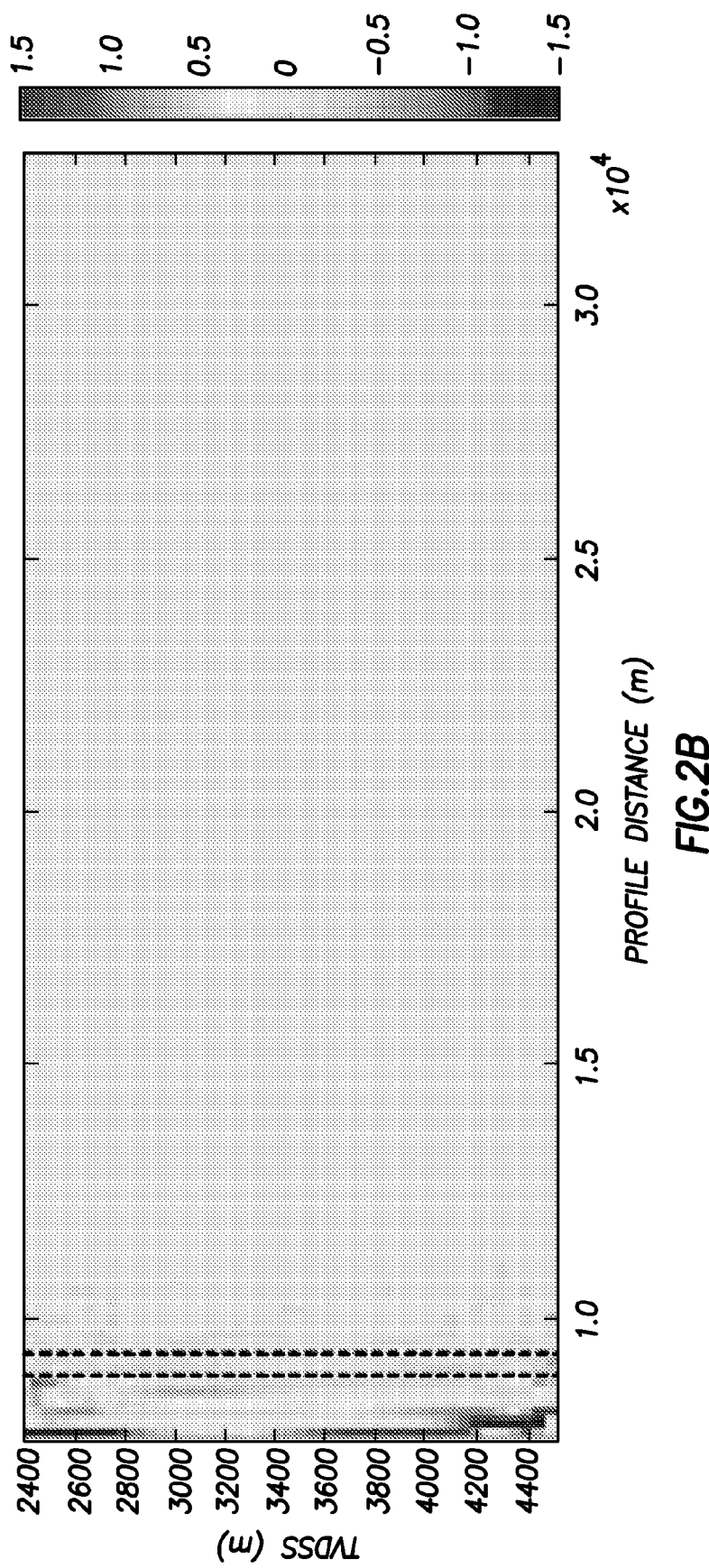
Figure 2C:
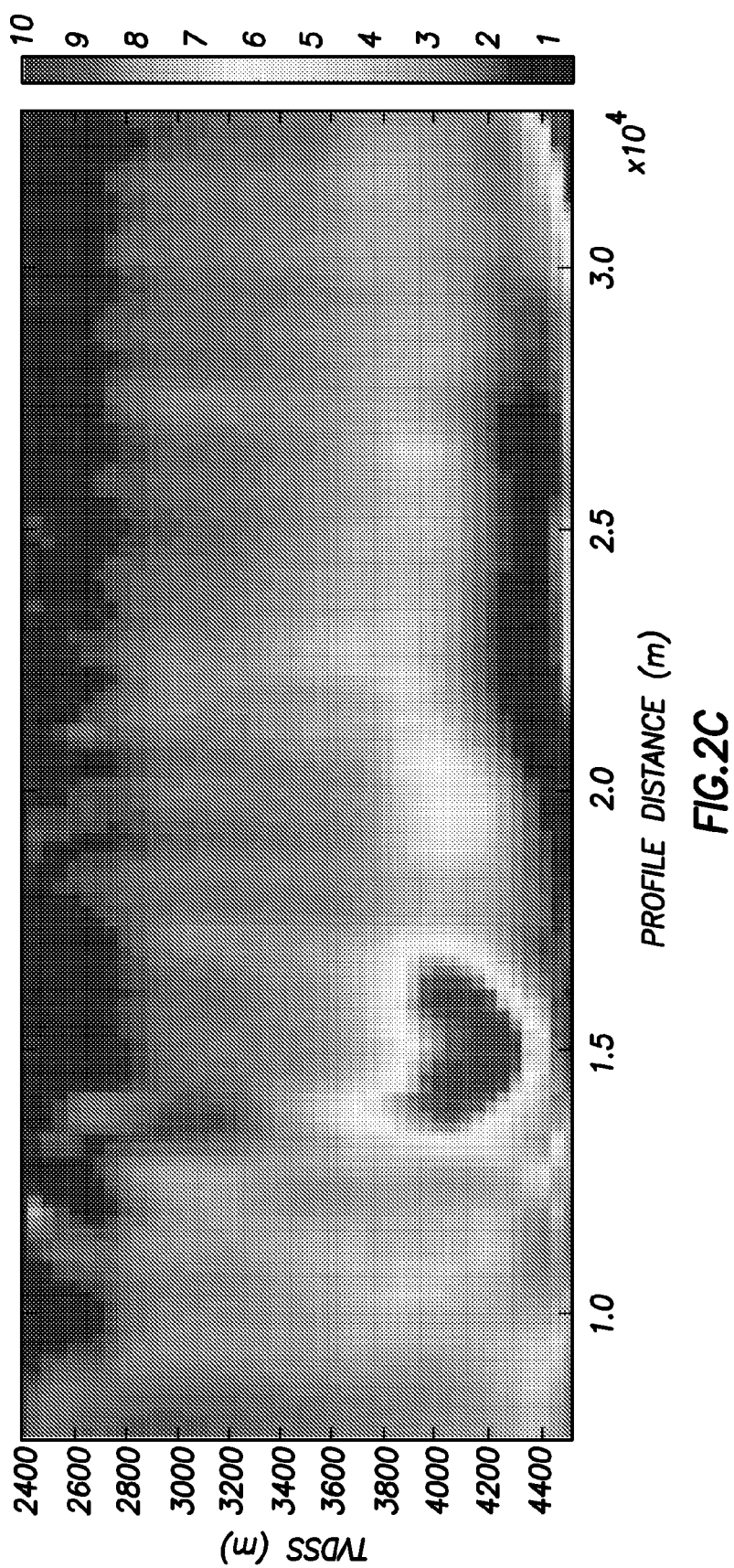
Figure 3:
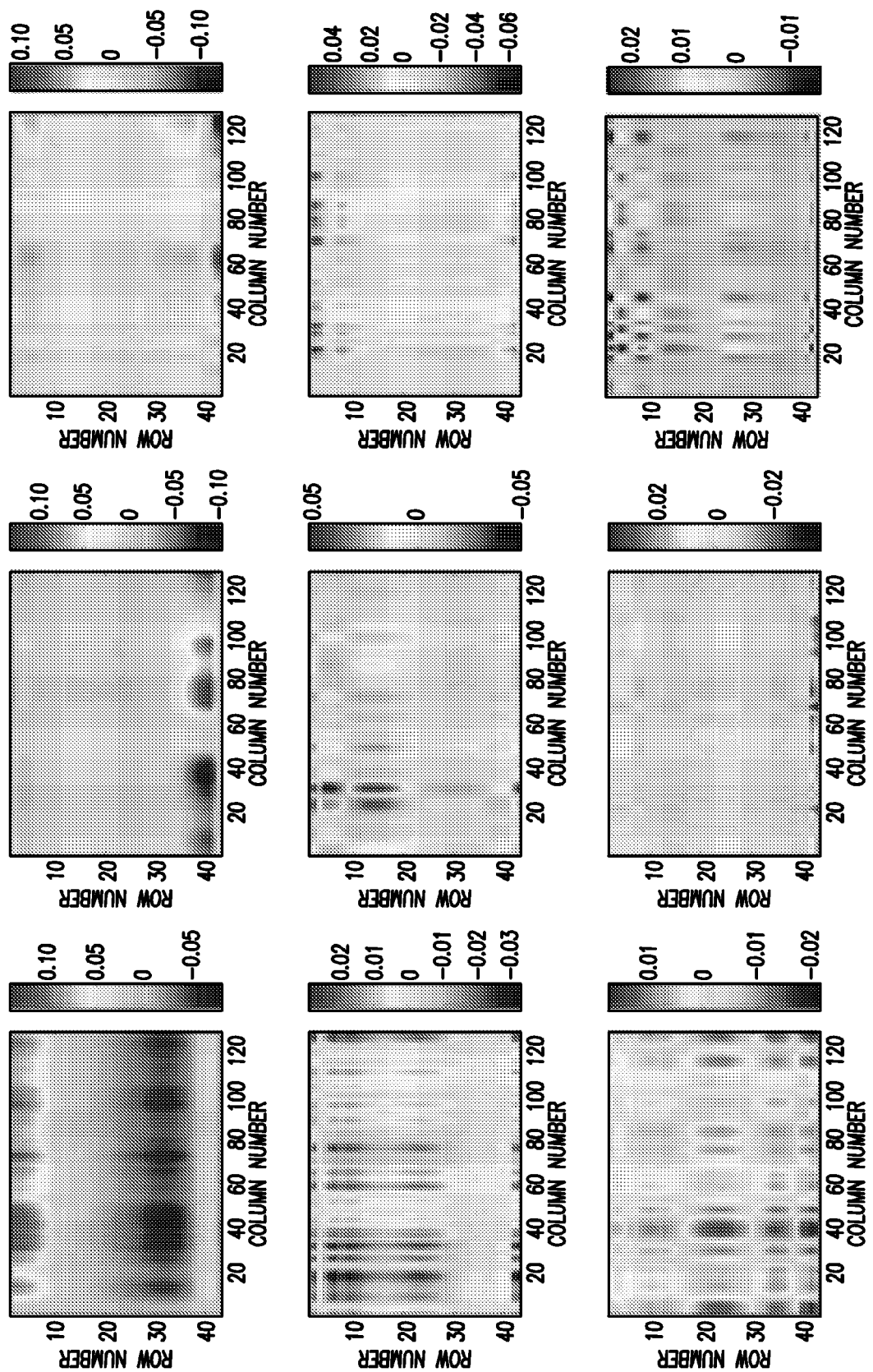
FIG. 3 shows the nine individual basis matrices (43×127 cells) determined using equation 8 and used in the compression of the 2D model in FIGS. 2A through 2C.

$v_i$ is a base of the image containing the variability from the ith row of $U_{image}$. In total, there is a set of d basis matrices that expand most of the variability of the original model. For consistency with equation 3, the matrices, $v_i$, may be reordered as column vectors of length N. A similar procedure may be performed column-wise, $V_{image} = m_r V$, if it is desired to compress the image vertically. The result of compressing the inverse model (127×43 cells) using the foregoing method is shown in FIGS. 2A through 2C. In the present example, most of the variation of 5,461 cells (80-90% thereof) have been compressed into only 6-9 orthogonal bases, as shown in FIG. 3. SVD is one example of reducing the size of the set of model parameters. Another example of a procedure to reduce the size of the model parameter set is the discrete cosine transform (DCT).

3. MODEL SAMPLE GENERATION

Once the new bases have been determined from one of the example methods above (e.g., SVD or DCT), any model belonging to the original space of plausible models, $m_k \in M$, can be represented as a unique linear combination of the orthogonal vectors:

$$m_k = \mu_{f,m} + \sum_{i=1}^{d} a_i v_i, \qquad (9)$$

where $\mu_{f,m}$ is the model mean from either method, and $a_i$ are real-valued coefficients. The only variables in equation (9) are the coefficients. Thus, the model space has been effectively reduced from N correlated pixels to d independent coefficients.

4. PARAMETER BOUNDS MAPPING

Once the base for the reduced model space is computed by either of the above described methods, it then becomes possible to solve the nonlinear uncertainty problem by generating a comprehensive set of equivalent earth models (i.e., spatial distribution of certain physical parameters of subsurface formations), $m_k$, from sampled coefficient vectors, $a_k = (\alpha_1, \ldots, a_d)$, and solving equation (9). Although sampling in the reduced space is sufficient to solve for the ensemble of equivalent models, it is not very efficient. In particular, every model, $m_k$, has a unique mapping to the PCA base via equation (9); however, the inverse is not true (i.e., the mapping is not bijective). That is, every sampled coefficient vector, $a_k$, need not produce a model in the feasible model space, $m_k \in M$. As described in Ganapathysubramanian and Zabaras (2007), it is possible to overcome such limitation by constructing a space of acceptable coefficient vectors, using parameter bounds (e.g., upper and lower limits on the possible values of a measurable physical parameter) in the original model space, whose resulting earth models therefore do belong to the feasible model space.

Construction of the space of acceptable coefficient vectors is equivalent to finding the largest subset of coefficient vectors, a∈S, such that all resulting models, m, are feasible models. To do this, individual parameter bounds, l(n) and u(n), are defined in the original N-dimensional model space (based on prior knowledge of the smallest and largest allowable or expected values of physical properties such as resistivity) and these are "mapped" to the reduced-order space by solving a minimization problem with linear inequality constraints. Such may be performed as follows:

find the largest region S ⊂ M, s.t.

$$l(n) \leq \mu(n) + \Sigma_{i=1}^{d} a_i v_i(n) \leq u(n), n=1, \ldots, N. \quad (10)$$

The present solution to this problem is applying vertex enumeration in computational geometry (See Avis and Fukuda, 1992). In essence, all constraints in equation (10) are bounded by a hyperplane, which, together, define a convex polyhedron in the original N-dimensional space. The solution of mapping the parameter constraints to the reduced space (i.e., equation 10), then, is the computation of the vertices (intersections) of the polyhedron with the d-dimensional hyperspace (ortho-space) defined by equation (9). The result is a bounded convex polytope whose vertices represent extrema of the region S of allowable coefficient vectors a. Three conclusions follow: 1) the resulting polytope is not, in general, a hypercube, 2) sampling the polytope is equivalent to sampling the region of feasible points defined in the original model space, and 3) geometric approximations to the polytope will be required unless the number of vertices is small. To implement constraint mapping in the present example, equation (10) may be solved, for example, using the double description method described by Fukuda and Prodon (1996).

5. SPARSE GEOMETRIC SAMPLING

The next step in the method is to sample the posterior polytope, S, resulting from the solution of equation (10), and determine the resulting set of models, m, that represent the uncertainty of the modeling problem. However, determining where and how much to sample the polytrope is not trivial. One scalable way to sample the polytope is to circumscribe it with a d-dimensional hypercube, so sampling can be performed on a Cartesian grid in the reduced model space (instead of sampling interior points directly using the vertices). This approach only approximates the polytope, which introduces some infeasible coefficients (i.e., regions within the reduced space but outside the polytope). However, as will be explained below, all the model samples generated from the sampled coefficients can be determined prior to any forward evaluations. Thus, it is possible to test and accept or reject model samples for feasibility (by mapping back to the original model space using equation (9)) before any computationally costly forward solutions are made. Though this introduces some small inefficiency in the sampling, it is still more efficient than either sampling the polytope vertices directly or not computing the polytope at all. The latter efficiency is because the circumscribed hypercube is only partially empty with respect to feasible coefficients. A completely unbounded reduced-dimensional space is still substantially empty (See Tarantola, 2005), and sample rejection could be quite inefficient without constraint mapping as described above.

Before it is possible to sample along the axes of the reduced-dimensional hyperspace, the sampling scheme should be determined. For spaces larger than a few dimensions, uniform sampling is not practical, because the number of samples grows exponentially with the dimension of the hyperspace. As explained in Xiu and Hesthaven (2005), an alternative is a scheme used in multivariate interpolation: Smolyak's method. With this method, univariate interpolation formulas (e.g., Gauss quadrature, Chebyshev polynomials) are extended to the multivariate case by using only partial tensor products (Xiu and Hesthaven, 2005). Following such formulation, it becomes possible to form a 1-D interpolation for a smooth function $f$ as:

$$U^i(f) = \Sigma_{k=1}^{m} f(Y_k^i) a_k^i, \quad (11)$$

where both $f$ and the weights $a_k^i$, which are given by the chosen interpolation formula (e.g., $e^{-x^2}$ for Gauss-Hermite), are evaluated at nodes, $Y_k^i$, in the nodal set:

$$\Theta^i = (Y_1^i, \ldots, Y_m^i). \quad (12)$$

These are determined by roots of the interpolation polynomial chosen. The Smolyak method gives the multivariate extension of this 1D interpolation in d-dimensions:

$$A(q, d) = \sum_{q-d+1 \leq |i| \leq q} (-1)^{q-|i|} \cdot \binom{d-1}{q-|i|} \cdot (U^{i_1} \otimes \ldots \otimes U^{i_d}), \quad (13)$$

where $i = i_1 + i_2 \ldots + i_d$ represents the individual dimension indices of the multivariate space, ⊗ is the Kronecker product, and, q=d+k, may be defined as the level (coarseness) of the interpolation. The sparse nodal set that results from equation (13) and a given interpolation coarseness level q is:

$$H(q,d) = U_{q-d+1 \leq |i| \leq q} (\Theta_1^{i_1} x \ldots x \Theta_1^{i_d}). \quad (14)$$

If Chebyshev polynomial roots are chosen for the nodes, the number of nodes generated for H(q,d) is given by:

$$\dim(A(q, d)) \sim \frac{2^k}{k!} d^k, d \gg 1, \quad (15)$$

which is much less than that given by full tensor products, $k^d$, when d>k. The foregoing procedure allows for the application of sparse grids to problems of large dimensions. Perhaps equally important is the fact that the nodes provided by this formula are nested. If it is desirable to improve the accuracy of the interpolation from a selected level q to a higher selected level (e.g., q+1), it is only necessary to sample at the differential nodes between the two interpolation levels, which provides a means for optimizing sampling. That is, one only need evaluate samples at very sparse grid levels at first, then incrementally increase the sample evaluation level until some defined or predetermined degree of convergence occurs. If the model sampling problem is then considered as an interpolation problem over the d-dimensional hypercube approximation to the polytope, one can use the sparse nodal sets as the coefficient samples, $a_k$, and compute their corresponding posterior models using equation (9). In order to determine whether the sampling is sufficient, one may compute an RMS error for uncertainty measures (e.g., covariances or variances) of the posterior at various grid levels. The present example method uses a relative RMS computed as follows:

$$\text{RMS} = \sqrt{\frac{1}{N^2} \sum \left( \frac{(C_{ij}^q - C_{ij}^{q+1})}{\min(C^{q+1})} \right)^2}, \quad (16)$$

where the sum in equation (16) is performed over all covariance indices, and $N^2$ represents the total number of elements. In cases where a model covariance is not explicitly computed, the matrix C in equation (16) can be replaced with a suitable uncertainty alternative, for example, the model variance vector.

6. SAMPLE EVALUATION

The final step in uncertainty estimation is to evaluate the posterior model samples for their probability (i.e., data misfit). For this, forward simulations may be performed and models may be accepted or rejected based on a selected or predetermined threshold misfit. The accepted models represent the equivalence space of models (i.e., the model posterior). The uncertainty of the nonlinear inverse problem then follows from either the set of models itself or statistical measures (e.g., mean, covariance, percentile, interquartile range) computed from the model set. Furthermore, because sampling is based on the feasibility of models, which are only generally consistent with the earth model, there may be some models which fit the measured data but are not geologically feasible. In this case, a final rejection of models may be required based on user-interpretive considerations.

7. EXAMPLES

1D Marine CSEM Example

Consider the simple 1D marine CSEM problem and its corresponding deterministic inverse solution, i.e., the bold black line in FIG. 1A and the linearized model covariance in FIG. 1B. In this example, the data space includes 34 complex-valued radial electric field measurements made at two frequencies (0.25 Hz and 1.25 Hz) and uniform offsets (transmitter to receiver distances) ranging from 500 to 7000 meters. The true earth model has a target high resistivity zone (30 Ω-m) that is 100 m thick at 2200 m depth. The inverse model space included 33 fixed-depth layers of unknown isotropic resistivity (all with 1.0 Ω-m starting values) and 2 layers of known resistivity (seawater having resistivity of 0.3 Ω-m and air having resistivity of 1.0e+10 Ω-m). For the purpose of the present invention, processes to obtain the inverse model may be any known in the art and are not a limit on the scope of the invention, as the focus of the method of the invention is on the uncertainty problem and not any one inversion solution.

Figure 4B:
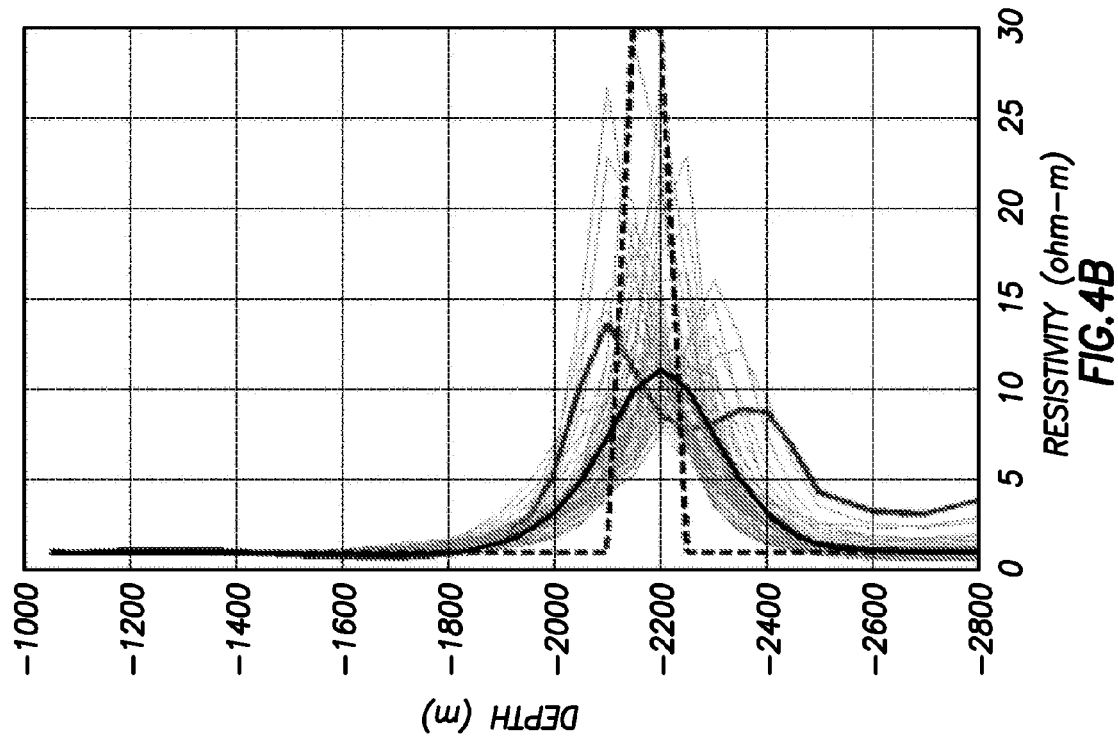
FIGS. 4A through 4C show controlled source electromagnetic (CSEM) model posterior ensembles.

Using both the deterministic inverse solution and its linearized covariance matrix (FIG. 1B), the principal components were computed (using equation 3) and determined that the first four eigenvectors represented about 70% of the total variance of the covariance matrix $C^{lin}$ (See FIG. 1C). The corresponding four-dimensional vertex enumeration problem was then solved using equation (10) based on homogeneous global bounds (l=0.5 Ω-m; u=33 Ω-m) for all unknown layers. The resulting posterior polytope was defined by 120 vertices, which were approximated with a 4-D hypercube. Based on Smolyak sparse sampling of this hypercube at interpolation levels q of zero through 6, it was determined that level q=5 was optimal (providing 99 equi-feasible samples) and generated the model ensemble shown in FIG. 4A. Based on a target data $\text{RMS}_{DATA}$<10%, 38 samples were rejected leaving 61 equivalent models in the final ensemble (FIG. 4B). An experimental covariance matrix (FIG. 5B) was computed from this model ensemble using the expression, $$C^{nl} = \frac{1}{K} \sum_{i=1}^{K} [m_i - \mu]^T [m_i - \mu], \quad (17)$$

where K is the number of equivalent models, $m_i$, and $\mu$ is, in this case, the mean of the set of models.

Figure 4A:
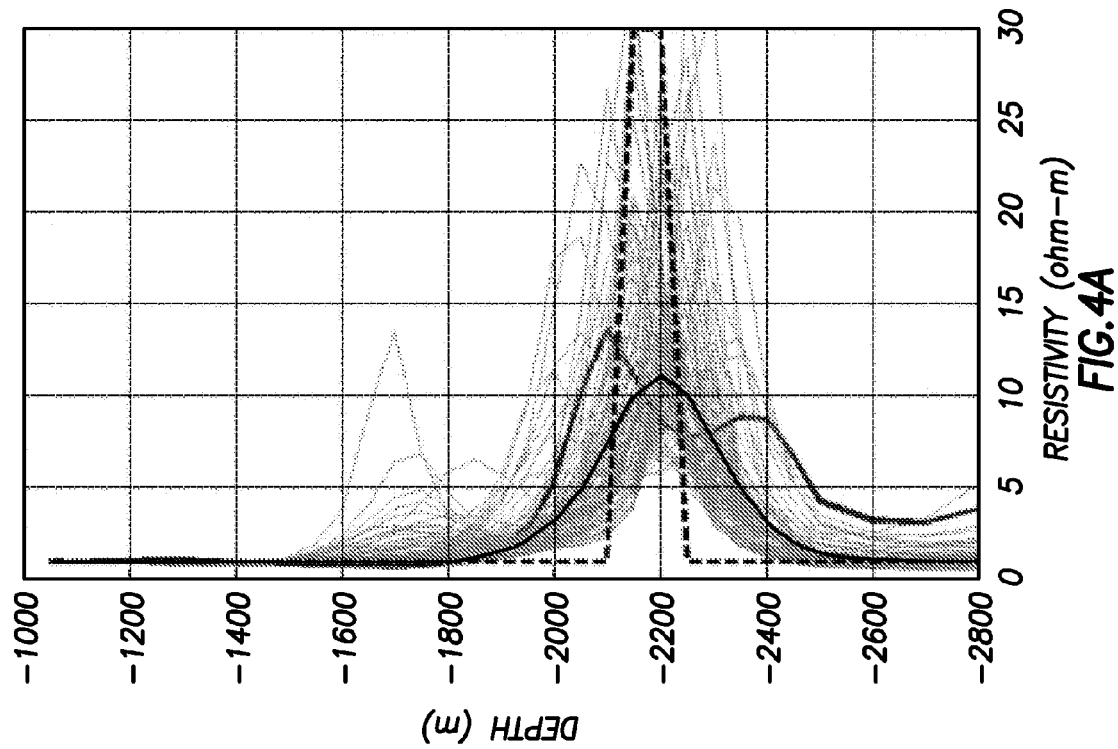

It may be observed in FIG. 4A that the equi-feasible samples span a much broader class of models compared to the deterministic inverse solution itself—even including several models with two resistive layers located between 2200 and 2300 m depth (e.g., the line in FIGS. 4A and 4B). This may be expected given the "global" bounding constraints and limited resolution of CSEM measurements, but the result demonstrates the explorative nature of posterior sampling; two-resistive layer models would most certainly not be evident from inspection of only linearized uncertainties as may be observed in FIG. 5A.

While the above described sampling seems particularly sparse, the $\text{RMS}_{COV}$ error, as defined in equation (16), between nonlinear covariances at interpolation level q=5 (99 equi-feasible samples) and levels, q=6, 7, and 8, (262, 656, 1623 equi-feasible samples, respectively) was less than 2%. The reason for such convergence at sparse sampling levels is that the Smolyak nodes span as much of the hyperspace as possible at every grid level; the sampling is uniform over each dimension of the hypercube approximation to the polytope. It is worth noting that testing for convergence in this way is less appropriate for random sampling methods because convergence in any particular statistical moment may be a very poor measure of completeness when sampling non-uniformly.

Figure 4C:
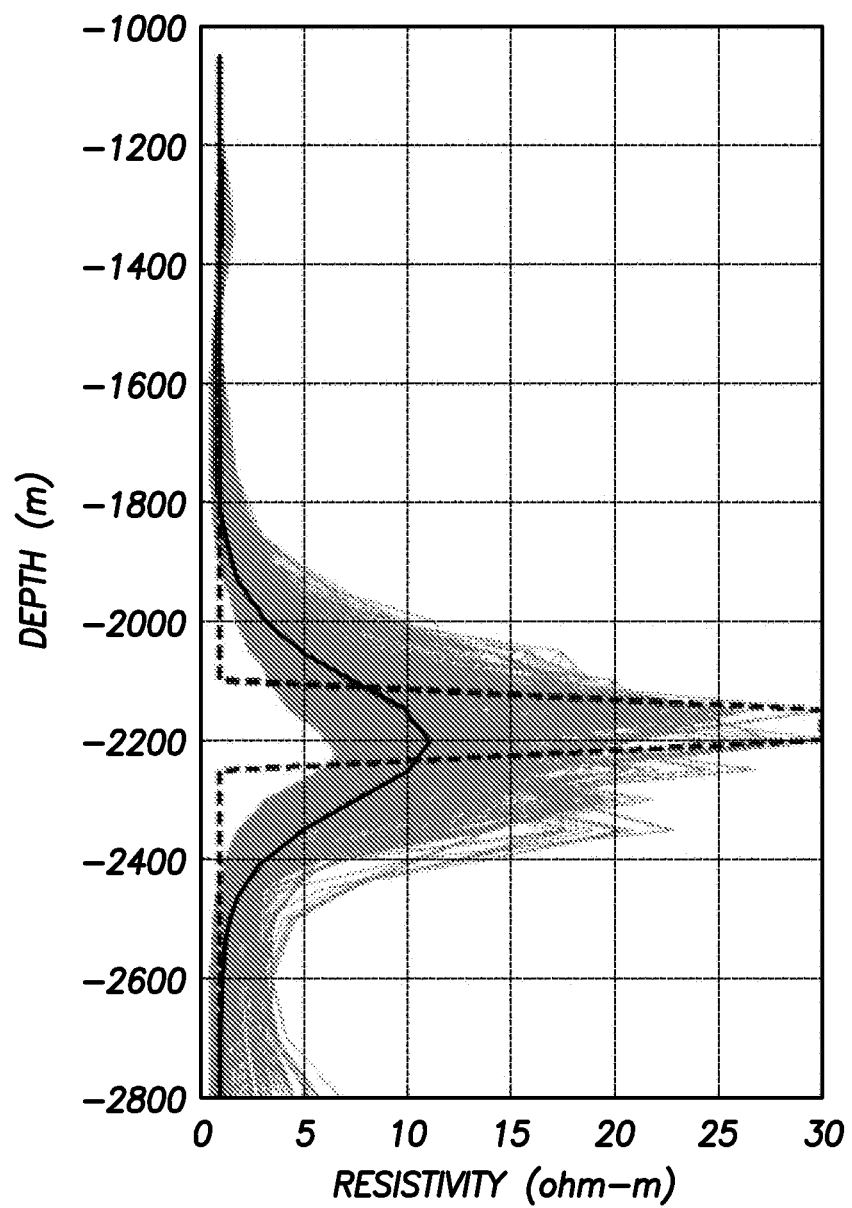
Figure 5B:
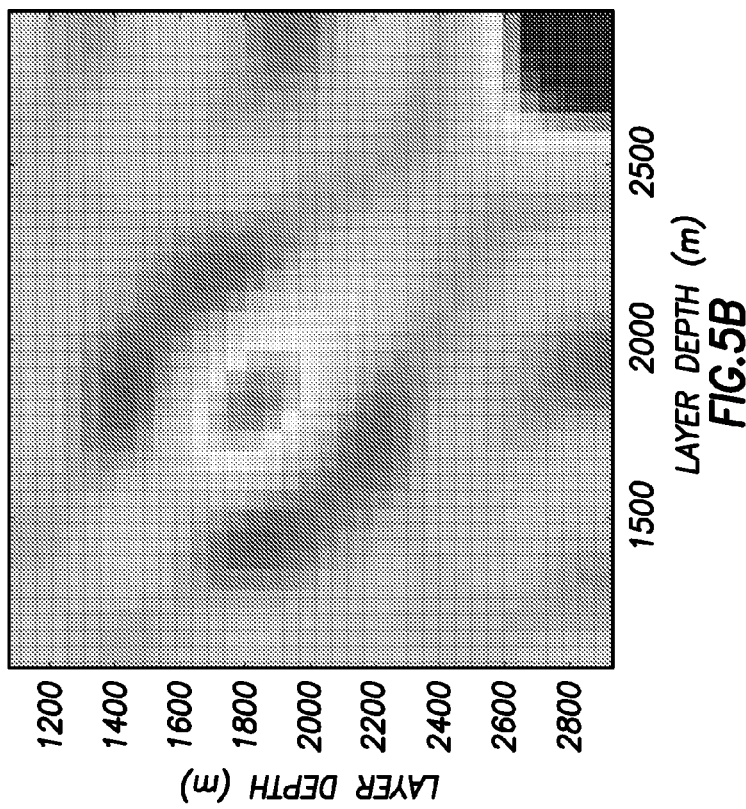
Figure 5A:
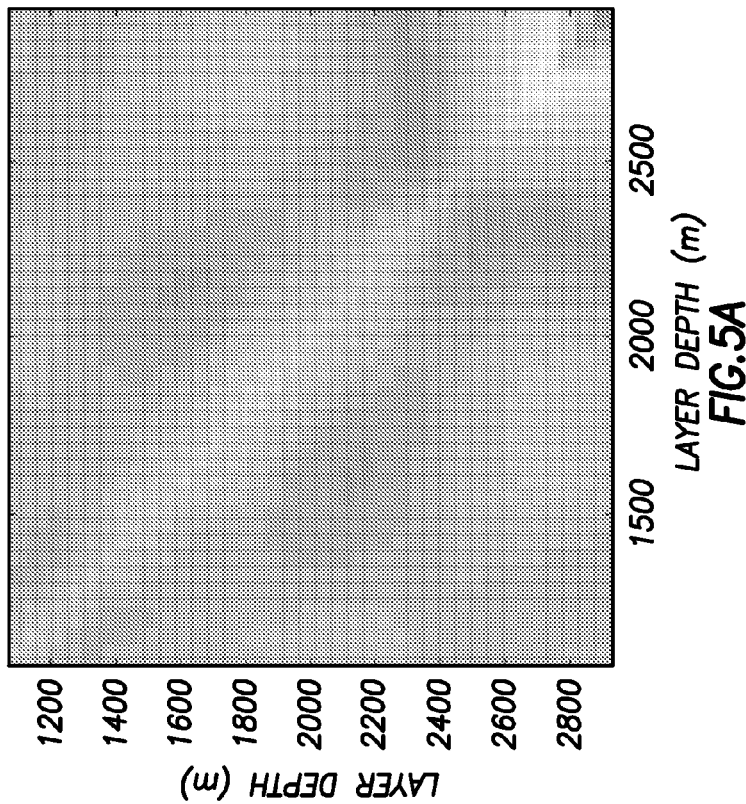

To demonstrate the completeness of the uniform sampling, the results of sparse sampling (at q=5) were compared to a much more exhaustive sampling as shown in FIGS. 4C and 5C. In the present case, all 120 vertices were sampled and their midpoint combinations (7201 samples) from the polytope (convexity of the polytope ensures these are interior or extremal samples). After misfit rejection, the final model set consisted of 1325 equivalent models (FIG. 4C). The result is that the class of models that fit the measured data seems to be similar in both the sparse and vertex-sampled ensembles. The similarity in magnitude and structure between the two nonlinear covariances in FIGS. 5B and 5C demonstrates the relative importance of where the samples are taken versus how much of the posterior is sampled. While the $\text{RMS}_{COV}$ error of the sparse covariance matrix is higher at ~40% compared to the more complete vertex-sampled covariance, this result is considered successful given that the sparse sampling represents a more than 72-fold reduction in forward solution calculations. In addition, both nonlinear covariances vary significantly in magnitude and structure when compared to the linearized covariances in FIG. 4A—particularly for covariance elements near 2000 m and variances below 2500 m depths.

2D Marine CSEM Field Example

To demonstrate the extension of the present method to large parameter spaces, the method was applied to an actual marine CSEM field data set. The data consisted of about 3800 complex-valued electromagnetic field property measurements at 4 frequencies (0.25, 0.50, 0.75, and 1.5 Hz). For this problem, the original uniform pixel space had 33,280 parameters (x=208 cells; z=160 cells); however, only the part of the final inverse model not occupied by air, seawater, or homogeneous resistive basement (>4500 m depths) was considered. The foregoing limitation left the inversion domain shown in FIG. 2A, which consisted of 5,461 parameters (x=127 200 m cells; z=43 50 m cells). Of particular interest, are the structures and magnitudes of the resistive features at ~4000 m TVDSS (FIG. 2A).

Figure 6B:
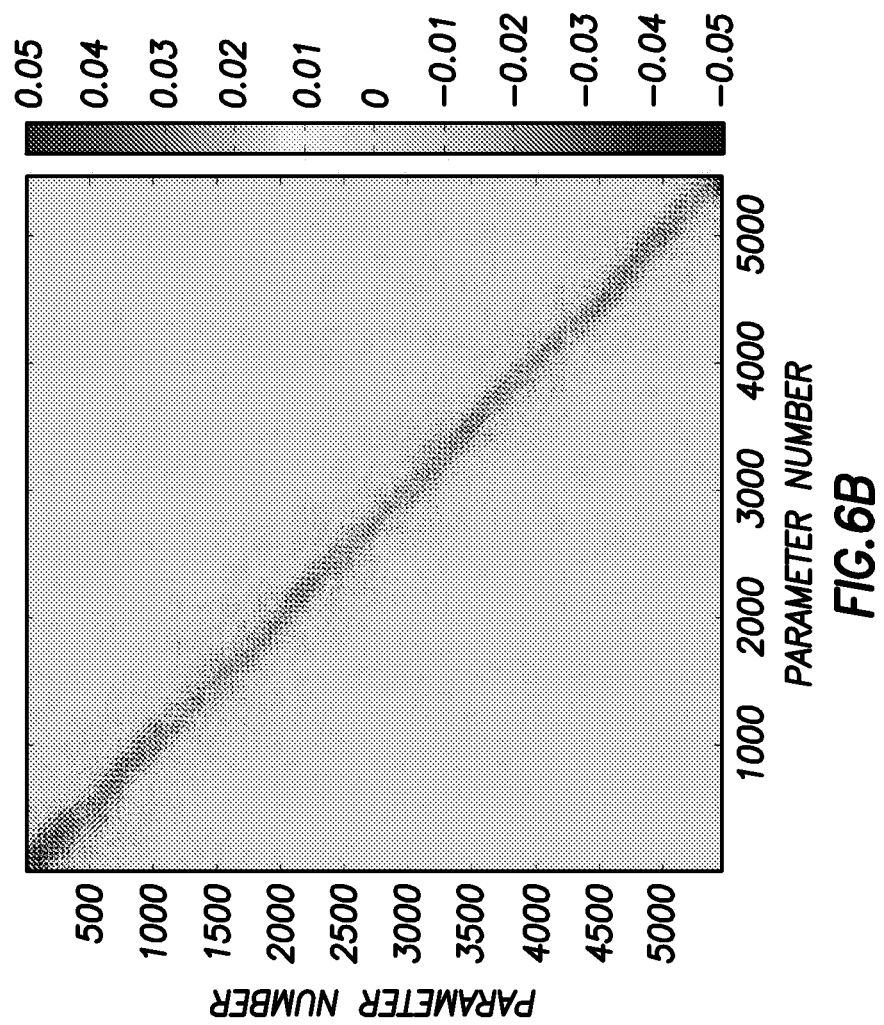
Figure 7A:
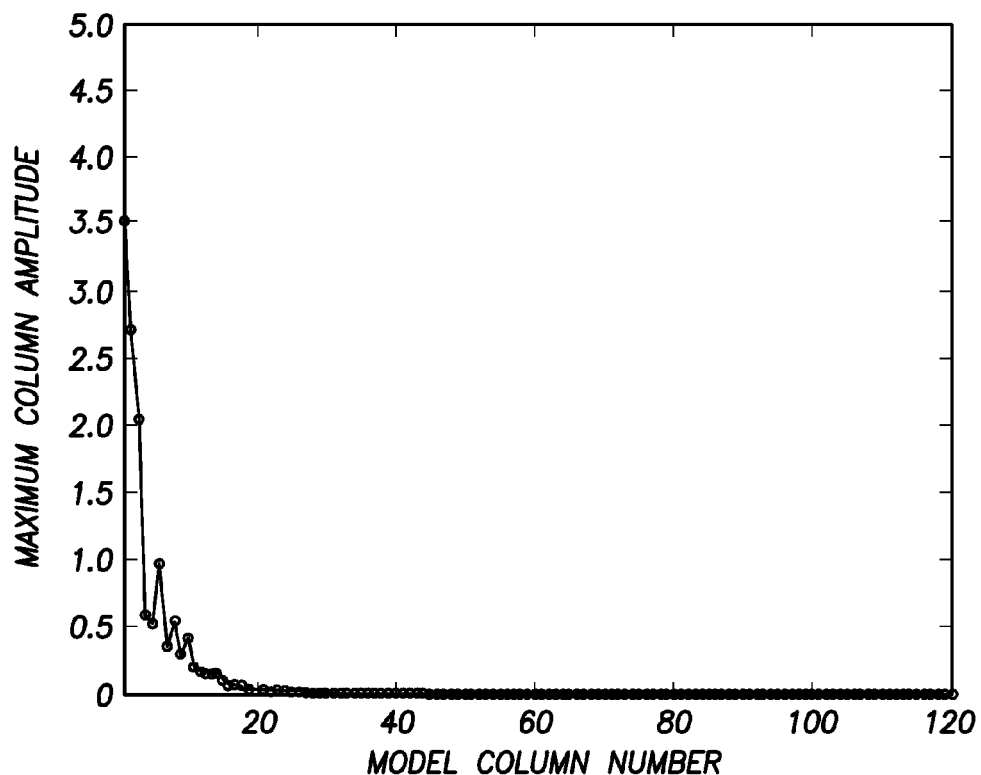
FIG. 7A shows the 120 column maximum amplitude values computed from the model-based SVD compression in FIG. 2B.
Figure 7B:
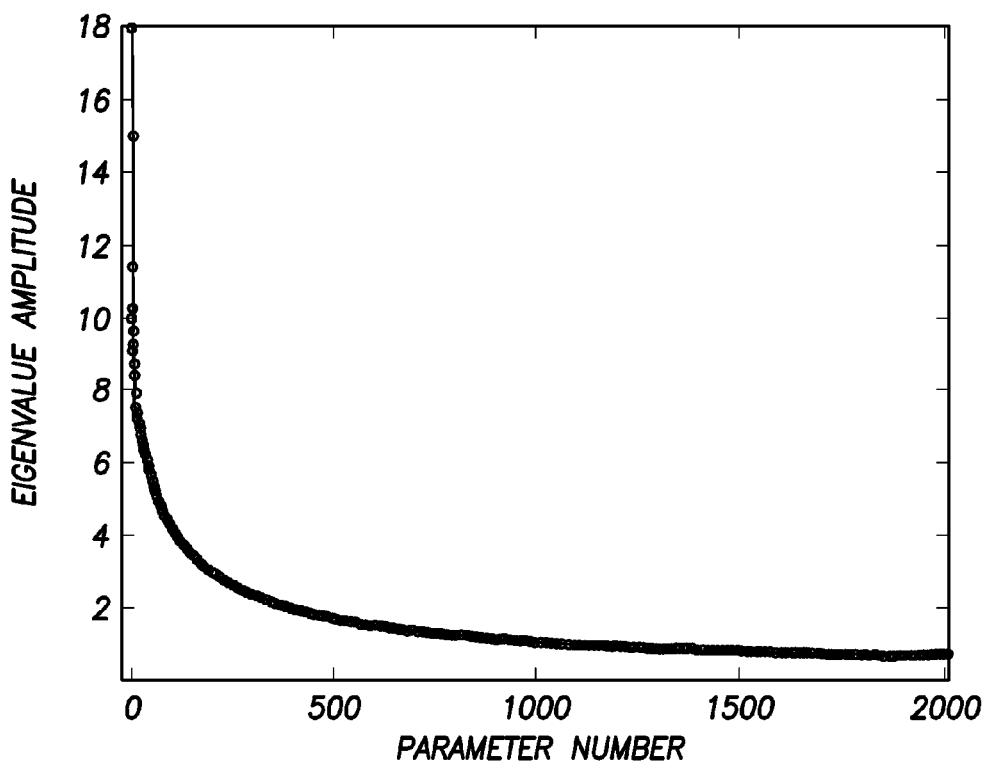

The linearized covariance matrix, computed using equation (2), for this inverse solution is shown in FIG. 6B. Since this parameterization produces a large (0.5 GB) model covariance matrix, the alternative PCA method as described above was tested using the column-SVD of the inverse model as discussed before. After subtracting a global mean (0.43 S/m) from the inverse model, the first six bases were chosen (FIG. 3) from the model SVD that represented about 81% of the variability in the residuals as shown in FIG. 7A. In comparison, the PCA of the linearized covariances (per equation (3)) produced only small reductions requiring as many as 1000 eigenvectors (of 5,461 total) to represent only 50% of the variance around the solution as shown in FIG. 7B. The reasons for this failure of the covariance PCA to effectively reduce the parameter space may have two probable explanations: 1) regularization acts to diagonalize the model Hessian so efficiently that it renders any PCA of the resulting covariance ineffective; and 2) the Jacobian itself does not properly represent the correlation of model parameters in the model space. This is because the Jacobian is a linearization about the last iteration of the inverse solution, and the nominal cell size in the model does not accurately represent the true resolution (and correlation) of the present technique. Thus, the Jacobian is inappropriately sparse. For the following uncertainty analysis, only the SVD model parameter compression was used.

Once orthogonal bases are established, equation (10) may be solved again using homogeneous upper bounds (e.g., u=12.5 Ω-m) for parameters in the original space. Because it was desirable to constrain the conductivity parameters (background values) more tightly, inhomogeneous lower bounds were chosen that depended on individual parameter variances. The range of these lower bounds was 0.667-1.18 Ω-m and was computed based on the square root of the linearized parameter variances (FIG. 6B). The resulting posterior polytope was defined by 15,990 vertices, which, in this case, was approximated with a 6-D hypercube (i.e., 6 bases were chosen). Based on sparse sampling of this hypercube at levels q=0-3, 4, and 5 (177, 428, and 1337 samples) and a convergence at level q=5 ($RMS_{COV}$ between levels q=4 and 5 was approximately 4%), 1942 equi-feasible models were evaluated (e.g., FIGS. 8A1, 8A2, 8B1 and 8B2). The computational cost of evaluating these models was approximately 6 days using two 8-core workstations. With a threshold misfit, $RMS_{DATA}$<15%, a final equivalent model set (283 models) was generated with examples therefrom shown in FIG. 9 and statistical measures presented in FIG. 10 and FIGS. 11A through 11D. For comparison, the nonlinear covariance matrix is displayed alongside the linear estimates in FIGS. 6A and 6B.

8. MODEL ENSEMBLE

Figure 9A:
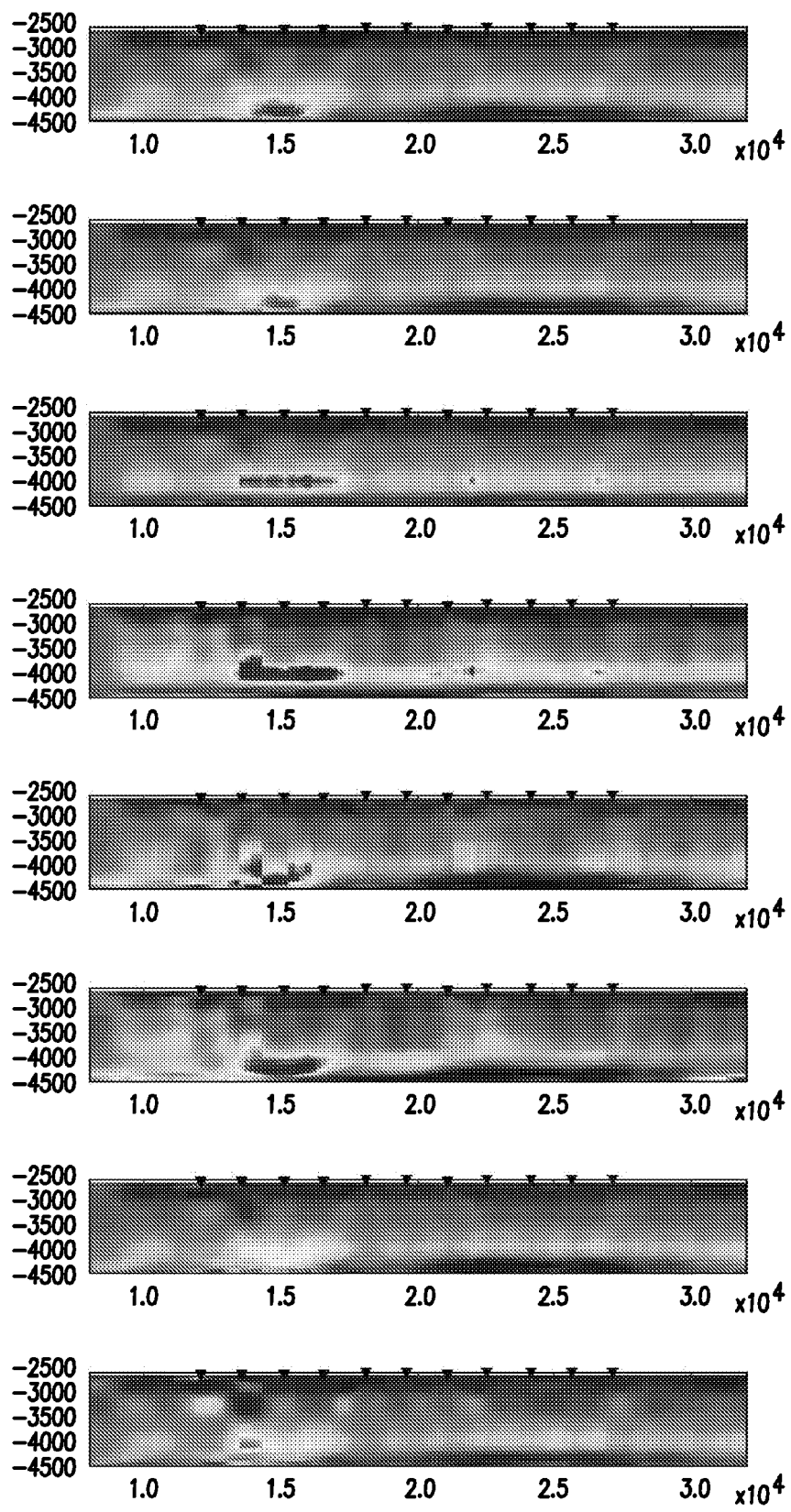
FIG. 9 shows example 2D resistivity earth models taken from the "equivalent" model ensemble generated as the solution to the uncertainty problem.
Figure 9B:
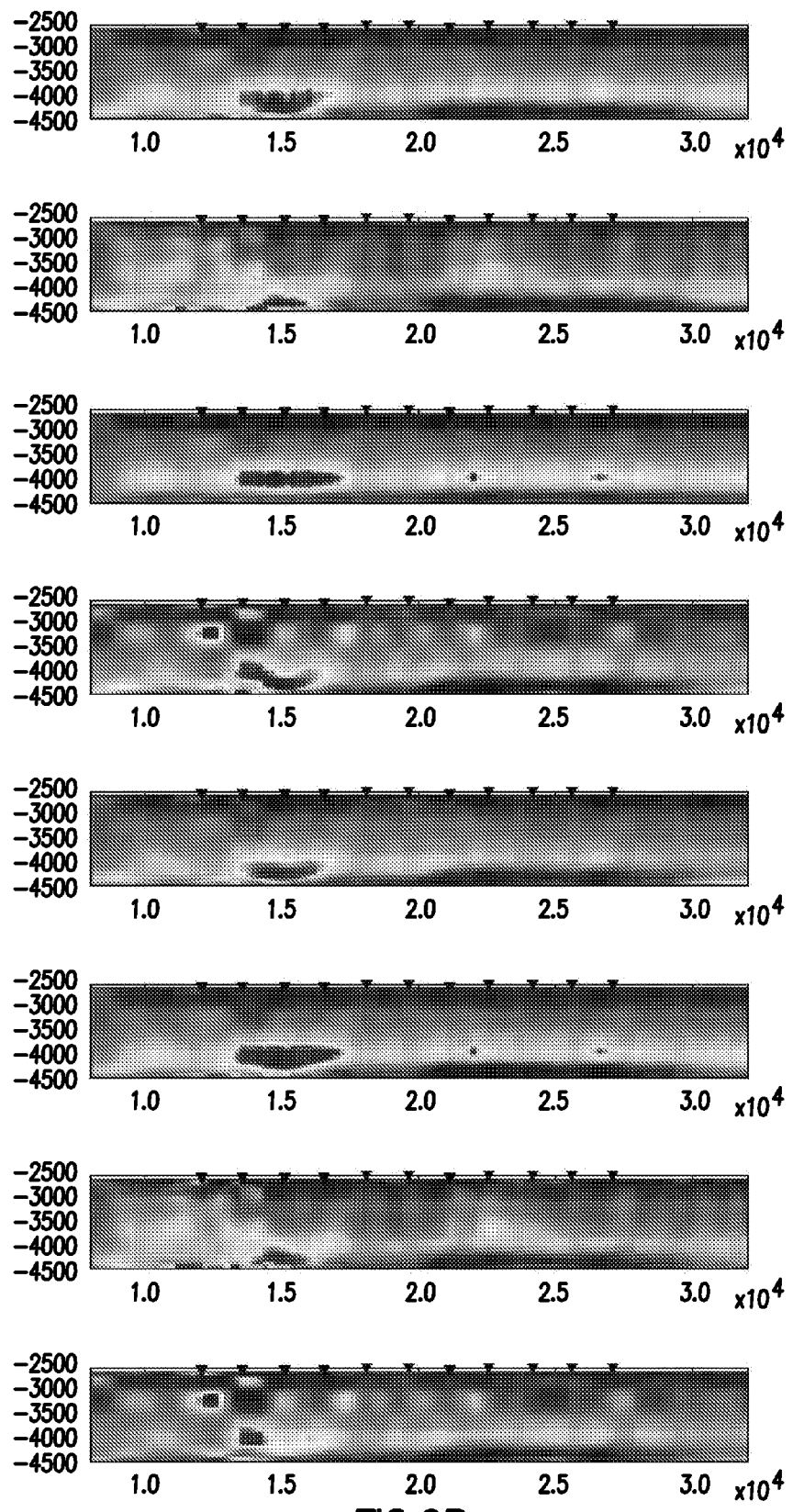

The meaningful results from the present example 2D uncertainty analysis are the two example model ensembles presented in FIGS. 8 and 9. It is here that one can evaluate both the explorative nature of the present method as well as the breadth of equivalence of the inverse solution. From the equi-feasible model ensemble in FIGS. 8A1, 8A2, 8B1 and 8B2, the entire range of models is represented, it is clear that the present method includes sampling a variety of model "classes". In particular, there are 1) models that look similar to the initial inverse model (first rows in FIGS. 8A1, 8A2, 8B1 and 8B2), 2) models that have little contrast in resistivity (second rows in FIGS. 8A1, 8A2, 8B1 and 8B2), 3) models that are stratified (e.g., third rows in FIGS. 8A1, 8A2, 8B1 and 8B2), 4) models with dominant high resistivity zones between 20 and 30 km along the profile (fourth rows in FIGS. 8A1, 8A2, 8B1 and 8B2), 5) models with deeper resistive zones (fifth rows in FIGS. 8A1, 8A2, 8B1 and 8B2), 6) and even many geologic models with high spatial variations and shallower resistivity anomalies (sixth and seventh rows in FIGS. 8A1, 8A2, 8B1 and 8B2). This demonstrates that while these models all contain equally feasible resistivity parameters, as defined by the bounding constraints in equation 10, they span quite a wide range of structures. That is, the present method does not simply search a narrow class of models similar to the original inverse solution model. The reason is because the present method uses a wide range of coefficient vectors, $a_k$, to reconstruct new feasible models. The resulting sampling is explorative, but only within the confines of the parameter bounds and structures consistent with the orthogonal bases.

Although the present method searches a range of model types, it may be observed that only a few of them are consistent with the measurement data (See FIG. 9). Several classes from the equi-feasible model set, including the low contrast group, may be rejected based on the misfit threshold. In total, only about 15% of models evaluated met the misfit threshold, demonstrating that CSEM survey techniques presently in use may not result in non-unique geological models as is presently believed to be the case prior to the present invention. In particular, models containing a resistive layer at 15 km along the profile were most consistent with the measured CSEM data. This result adds confidence to the existence of the primary resistive zone at ~4000 m TVDSS. Interestingly, there is still measurable variation in the depth (4000-4500 m) of this resistive zone as well as its geometry. Resistive anomalies between 20 and 30 km also vary considerably in their continuity, thickness, and resistivities. Even some shallow variations seem to be supported by the measured data (rows 4 and 8 in FIG. 9). All of this demonstrates precisely the point of solving the uncertainty problem: to define regions of model space that have a high degree of certainty given the measured geophysical data and any other a priori available information, for example, reflection seismic data.

9. STATISTICAL MEASURES

Figure 10:
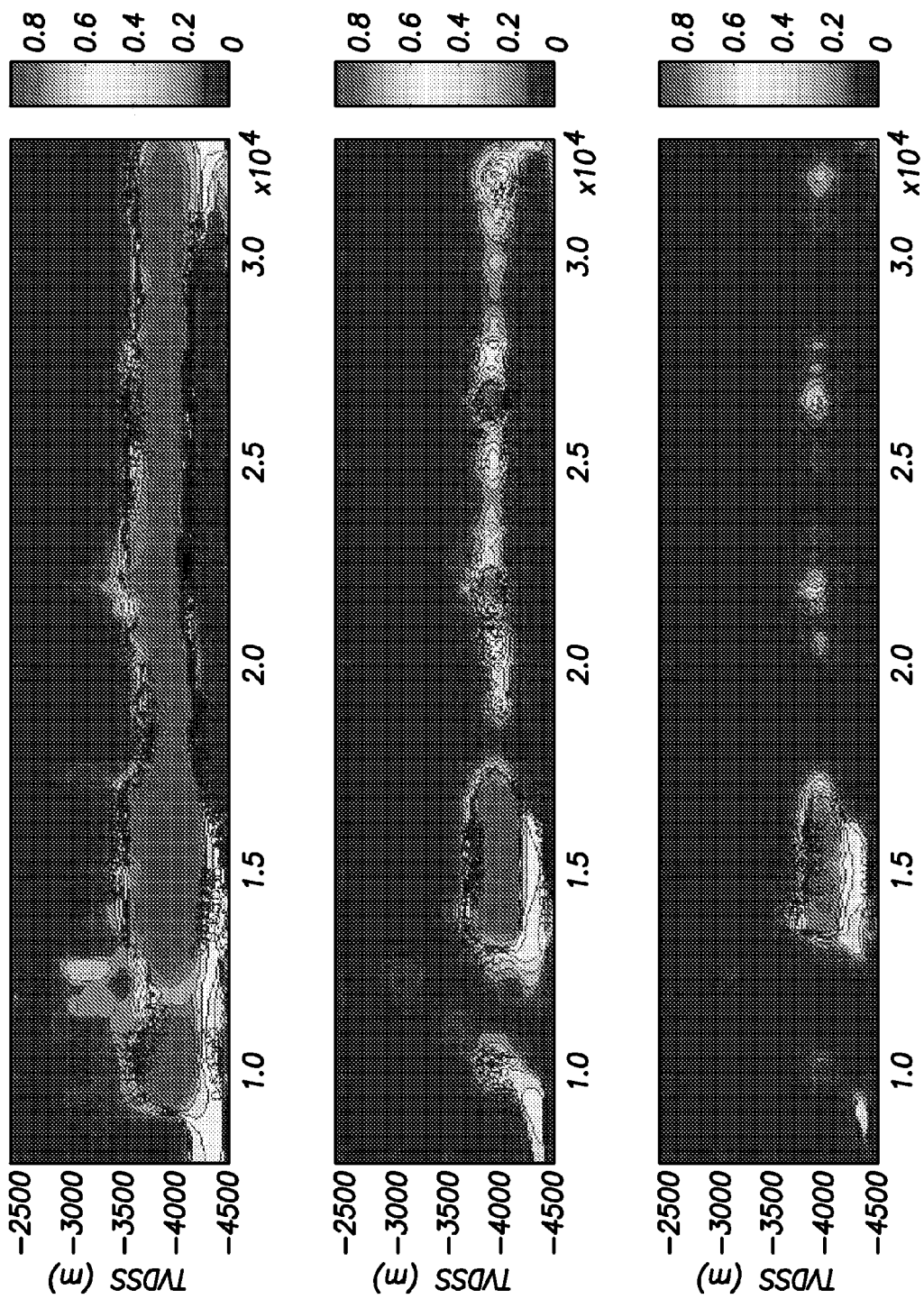
FIG. 10 shows indicator probability maps computed directly from the posterior model ensemble. The uppermost part of the figure is a map showing probability of greater than 3 Ω-m resistivity occurring in the posterior model space. The middle part of the figure is a map showing probability of greater than 4 Ω-m resistivity occurring in the posterior model space. The lowermost part of the drawing is a map showing probability of greater than 5 Ω-m resistivity occurring in the posterior model space.

Although evaluating the model set is important to understanding uncertainty—a point explained in Tarantola (2005)—it is not very interpretable. This is especially apparent when posterior model sets contain as many samples as in the present example (283). However, once one obtains such a model set, it is possible to compute statistical properties from it as well, for example, e-types, variances, or indicator probabilities. As explained in Gonzalez et al. (2008), probability (normalized frequency) maps are a useful way to visually present uncertainty. In the present example case, a probability map for a given resistivity category ($P(\rho > \rho_{target})$) may be computed by counting, pixel by pixel, the number of occurrences over the entire model set of this category, divided by the total number of models in the set. This is equivalent to computing the expectation of an indicator variable. Stated differently, a probability map can be evaluated as an estimate of the probability that each pixel in the map (i.e., each represented physical position in the plane or volume represented by the map) has a resistivity greater than some predetermined target value, given the posterior model set. Three such indicator probability maps for the present example 2D problem are shown in FIG. 10. The uppermost map shows the probability of at least 3 Ω-m resistivity, while the second and third maps show probabilities for 4 Ω-m and 5 Ω-m, respectively. One important property of the foregoing type of map, which may be referred to as a "parameter value cut-off map", is that they reduce to the dimensions of the model space and allow relatively easy interpretation of uncertainty around specific physical property ranges.

Figure 11A:
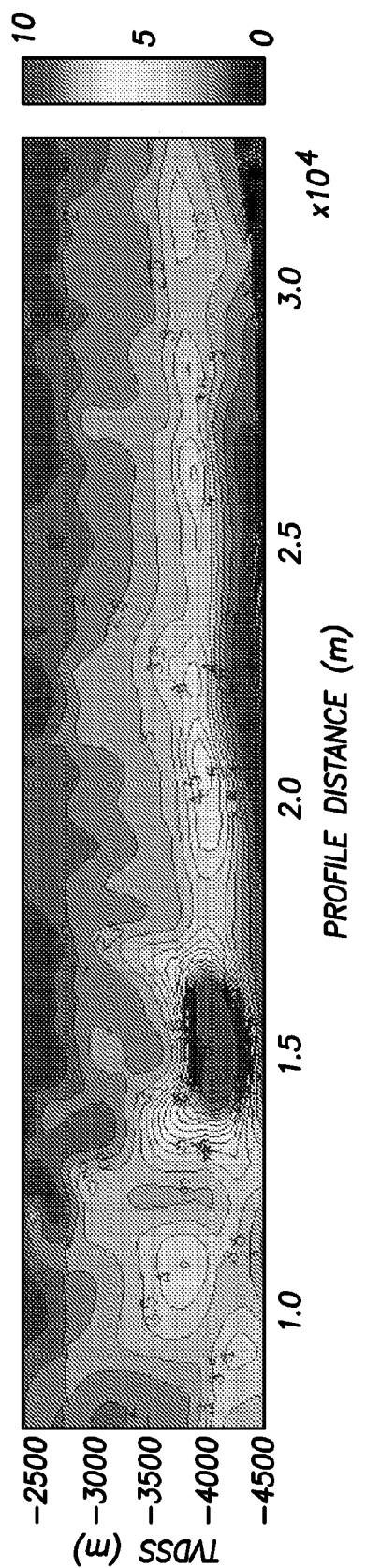
FIGS. 11A through 11D shows probability cut-off maps computed directly from the final posterior model ensemble.
Figure 11B:
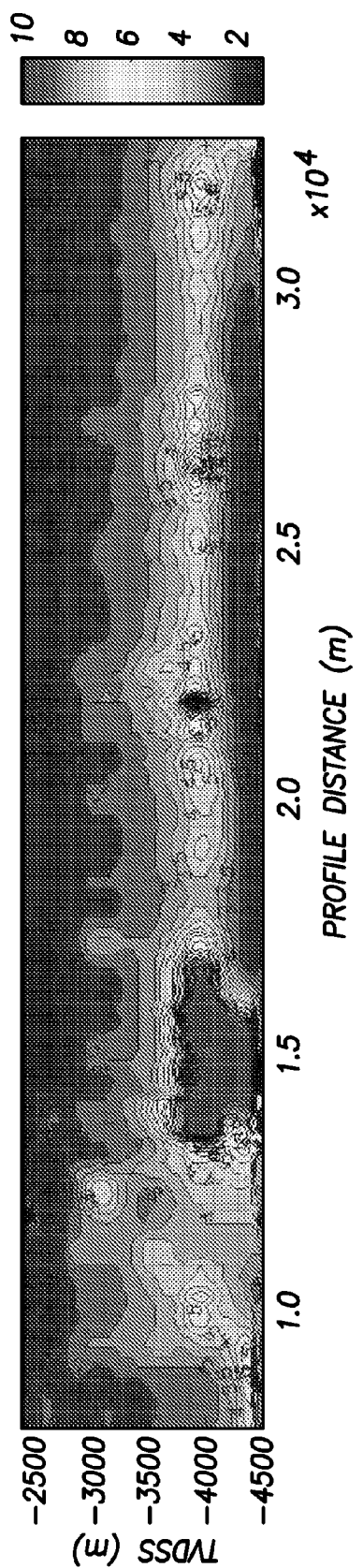
Figure 11C:
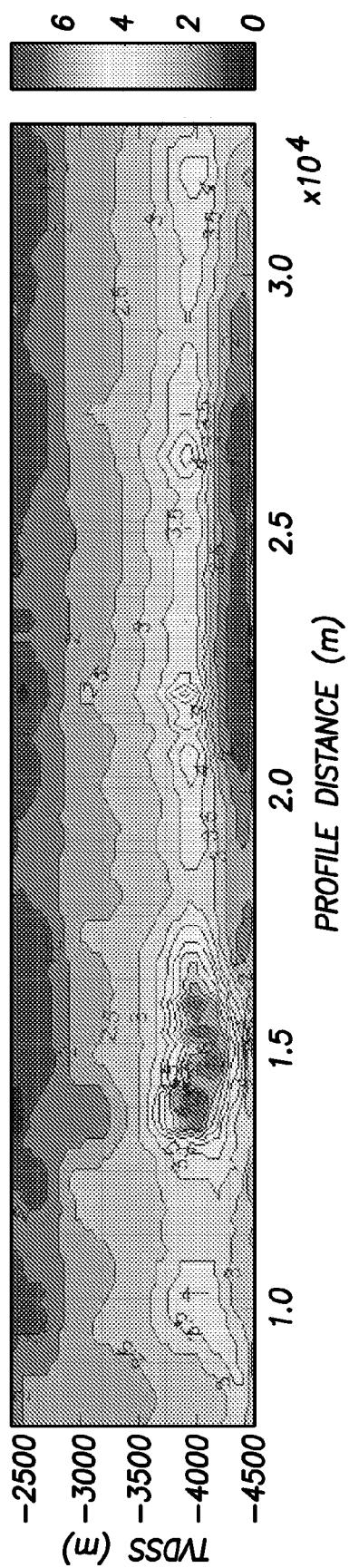
Figure 11D:
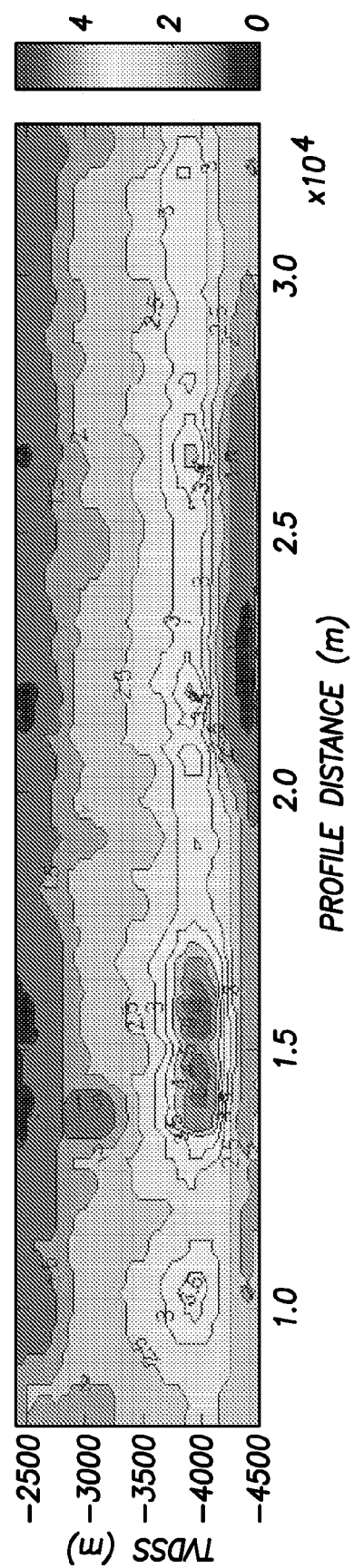

A second type of map is a probability cut-off map. Instead of selecting a resistivity cut-off, one may select a predetermined probability cut-off, say P(50), and find all resistivity values (e.g., $\rho$=1 Ω-m, 1.5 -Ω m, . . . , 10 Ω-m) in the model set where the indicator probability, defined before, is greater than the predetermined cut-off (e.g., P($\rho$)≥P(50)). Examples of probability cut-off maps are shown in FIGS. 11B through 11D and display all resistivities with probabilities of occurrence greater than three cut-offs: P(10), P(50), and P(90). The first contour map in FIG. 11A is the original inverse solution from FIG. 2. These probability cut-off maps are useful because they quantifying the probability of occurrence of specific types of structures, instead of specific resistivities, within the inverse model.

There is additional uncertainty information contained in the nonlinear model covariances as well (See FIG. 6A); they show much more correlation than that estimated with the linear covariances and represent, effectively, an entirely different statistical moment: one associated with the correlation of different classes of data-supported models rather than linear expansions from a single data-supported model (FIG. 6B). Previous work has suggested that linearized covariances may be different in magnitude but similar in structure to nonlinear covariances (See, e.g., Alumbaugh and Newman, 2000; Alumbaugh, 2002; Tompkins, 2003) a conclusion that is not supported by the 2D results presented in this description. In substantiation of the results presented herein, Fernández Álvarez et al. (2008) showed, for the vertical electrical sounding problem, that the linear and nonlinear regions of equivalent model space had different shapes. This causes the structures of the linear and nonlinear covariances to be different, since the linear region spans a narrower set of models. In any event, the 2D covariances are still much more difficult to interpret than statistical measures presented before, given their dimensions and necessary reordering of parameters (from 2D spaces to 1D arrays) for display. Furthermore, covariance estimates may not even be computable for large 3D parameterizations (millions of parameters).

10. CONCLUSION

The present description illustrates technique to efficiently estimate nonlinear inverse model uncertainty in any kind of inverse problem, and in particular to generating models of spatial distribution of physical parameters of subsurface formations given only sparsely sampled geophysical measurement data. The method has a background in three concepts: model dimension reduction, parameter constraint mapping, and very sparse geometrical sampling. It has been shown that the combination of these methods can reduce the nonlinear uncertainty problem to a geometric sampling problem in only a few dimensions, requiring only a limited number of forward solutions, and resulting in an optimally sparse representation of the posterior model space. While forward solutions are required to evaluate the sampled models, the present technique optimizes sample numbers by iteratively increasing grid level complexity until uncertainty measures converge. With a measured data example, it has been demonstrated that covariance-free model compression can provide a scalable alternative to conventional covariance-based PCA parameter reduction methods when parameterizations are large. It has also been demonstrated that while the present technique maintains consistency with a priori information, it is explorative and searches a wide range of models from the posterior. Once the model set is sampled, interpretation of uncertainty follows from either exploration of the equivalent model set itself or from statistical measures, such as the above described probability calculation producing the described maps.

Figure 12:
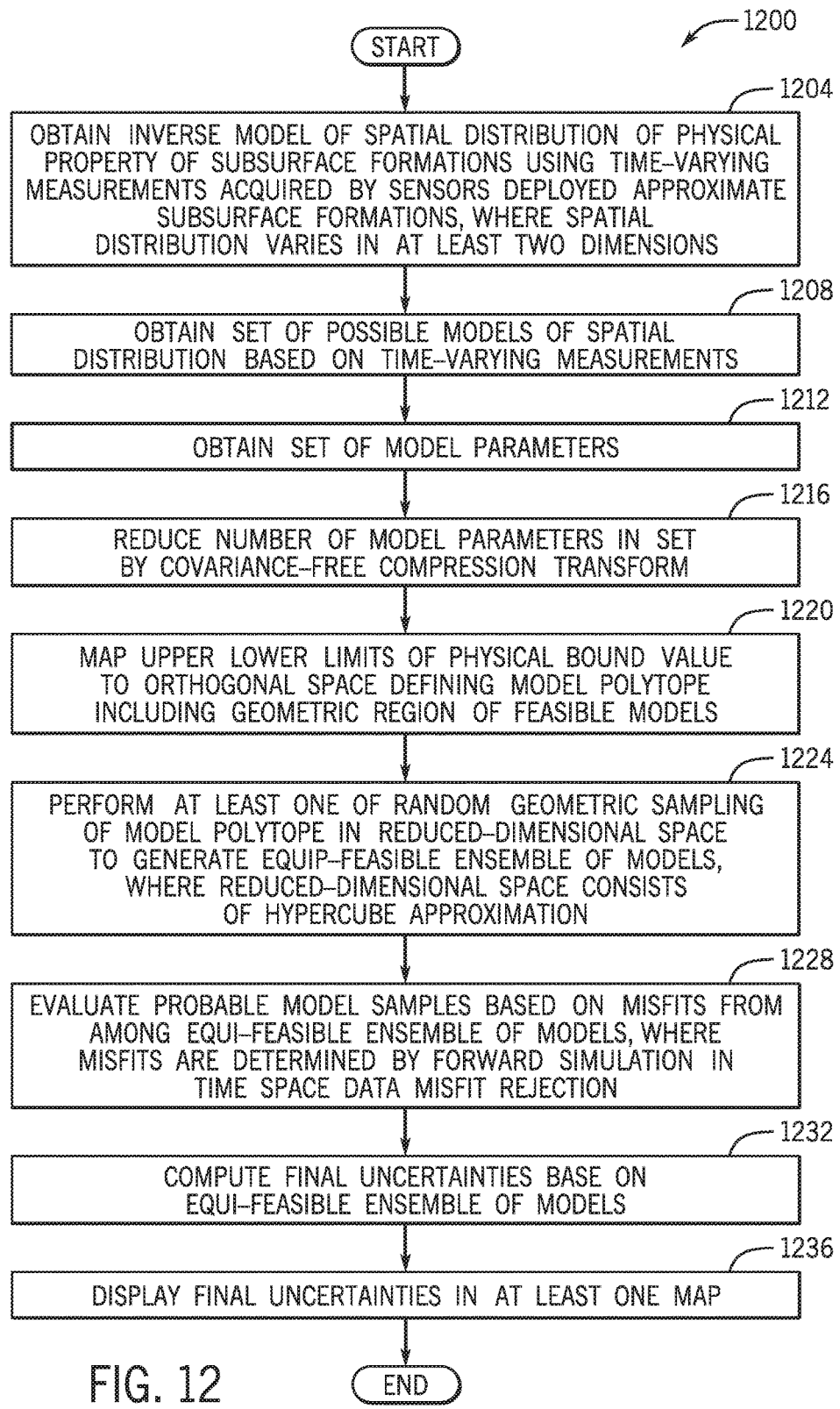
FIG. 12 is a flow diagram depicting a technique to estimate uncertainty for a nonlinear inverse problem related to determining the spatial distribution of a physical property of a subsurface formation according to an example implementation.

Referring to FIG. 12, thus, in accordance with example implementations, a technique includes obtaining (block 1204) an inverse model of a spatial distribution of a physical property of subsurface formations using time-varying measurements acquired by sensors deployed approximate the subsurface formations, where the spatial distribution varies in at least two dimensions. The technique 1200 includes obtaining (block 1208) a set of possible models of the spatial distribution based on the time-varying measurements. The technique 1200 includes obtaining (block 1212) a set of model parameters. The technique 1200 includes reducing (block 1216) a number of model parameters in the set by a covariance-free compression transform. The technique 1200 includes mapping (block 1220) upper and lower limits of a physical bound value to an orthogonal space defining a model polytope including a geometric region of feasible models. The technique 1200 includes performing (block 1224) at least one of random and geometric sampling of the model polytope in a reduced-dimensional space to generate an equi-feasible ensemble of models, where the reduced-dimensional space consisting of a hypercube approximation. The technique 1200 includes evaluating (block 1228) probable model samples based on misfits from among the equi-feasible ensemble of models, the misfits being determined by forward simulation in time and space and data misfit rejection. The technique 1200 includes computing (block 1232) final uncertainties based on the equi-feasible ensemble of models. The technique 1200 includes displaying (block 1236) the final uncertainties in at least one map.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method comprising:
    obtaining an inverse model of a spatial distribution of a physical property of subsurface formations made using time-varying measurements acquired by sensors deployed proximate the subsurface formations, wherein the spatial distribution of the physical property varies in at least in at least two dimensions;
    obtaining a set of possible models of the spatial distribution based on the time-varying measurements;

obtaining a set of model parameters;
reducing a number of model parameters in the set by a covariance-free compression transform;
mapping upper and lower limits of a physical bound value to an orthogonal space defining a model polytope including a geometric region of feasible models;
performing at least one of random and geometric sampling of the model polytope in a reduced-dimensional space to generate an equi-feasible ensemble of models, the reduced-dimensional space consisting of a hypercube approximation;
evaluating probable model samples based on misfits from among the equi-feasible ensemble of models, the misfits being determined by forward simulation for time-varying measurements and at least in two-dimensions, and data misfit rejection;
computing final uncertainties based on the equi-feasible model ensemble; and
displaying the final uncertainties in at least one map.

2. The method of claim 1 wherein the at least one map comprises a probability cut-off map.

3. The method of claim 1 wherein the at least one map comprises a parameter value cut-off map.

4. The method of claim 1 wherein the time-varying measurements comprise controlled source electromagnetic field measurements.

5. The method of claim 1 wherein the covariance free compression transform comprises singular value decomposition.

6. The method of claim 1 wherein the covariance free compression transform comprises a discrete cosine transform.

* * * * *